United States Patent [19]
Terashita et al.

[11] Patent Number: 6,057,038
[45] Date of Patent: May 2, 2000

[54] SUBSTRATE FOR USE IN DISPLAY ELEMENT, METHOD OF MANUFACTURING THE SAME, AND APPARATUS FOR MANUFACTURING THE SAME

[75] Inventors: Shin-ichi Terashita, Tenri; Shinji Yamagishi, Osaka, both of Japan

[73] Assignee: Sharp Kabushiki Kaisha, Osaka, Japan

[21] Appl. No.: 08/898,488

[22] Filed: Jul. 22, 1997

[30] Foreign Application Priority Data

Aug. 2, 1996 [JP] Japan .................................... 8-205032
Aug. 2, 1996 [JP] Japan .................................... 8-205045

[51] Int. Cl.$^7$ ....................................................... B32B 9/04
[52] U.S. Cl. .................. 428/447; 428/411.1; 252/299.4; 252/299.01; 252/299.61; 349/39; 349/44; 349/138
[58] Field of Search ........................... 428/1, 447, 411.1; 349/138, 39, 44; 252/299.4, 299.01, 299.61

[56] References Cited

U.S. PATENT DOCUMENTS

| | | | |
|---|---|---|---|
| 5,133,895 | 7/1992 | Ogawa et al. ........................ | 252/299.4 |
| 5,166,085 | 11/1992 | Wakai et al. ............................. | 437/40 |
| 5,244,595 | 9/1993 | Yamada et al. ..................... | 252/299.11 |
| 5,859,683 | 1/1999 | Tagusa et al. .......................... | 349/138 |

*Primary Examiner*—William Krynski
*Assistant Examiner*—Hong J. Xu
*Attorney, Agent, or Firm*—David G. Conlin; Richard E. Gamache

[57] ABSTRACT

A switching element is formed by sequentially depositing on an insulating substrate a gate electrode, a gate insulating film made of an inorganic insulating film, a semiconductor layer, a channel protecting layer, an n$^+$Si layer that will form a source electrode and a drain electrode. Next, a metal layer and a transparent conductive film are formed on edges of the source electrode and the drain electrode. The insulating substrate on which the above films have been deposited is cleaned with vacuum ultraviolet light, before further depositing an interlayer insulating film and a pixel electrode. A substrate for use in a display element obtained in this manner exhibits an excellent adhesion strength between the film processed with vacuum ultraviolet light and a film adjacent to the film processed with vacuum ultraviolet light.

Here, if a photosensitive resin blended with a silane compound is used as the interlayer insulating film, the adhesion is improved of the interlayer insulating film to the transparent conductive film and the inorganic insulating film that are in contact with the interlayer insulating film.

35 Claims, 10 Drawing Sheets

SUBSTRATE FOR USE IN DISPLAY ELEMENT, METHOD OF MANUFACTURING THE SAME, AND APPARATUS FOR MANUFACTURING THE SAME

FIELD OF THE INVENTION

The present invention relates to a substrate for use in display elements that are built in, for example, office automation (OA) equipment and audio visual (AV) devices, such as large-scale display devices, car navigation systems, and laptop-type personal computers, and further relates to a method of manufacturing the same and an apparatus for manufacturing the same.

BACKGROUND OF THE INVENTION

Recently, large-scale display devices, car navigation systems, laptop-type personal computers, and the like that are used as OA equipment and AV devices are increasingly required to be light in weight, thin, and power-saving. Therefore, as we move into multimedia society, lightweight, thin and power-saving display elements such as liquid crystal display elements are regarded as key devices, and a lot of efforts are being made on the research and development of such elements in various fields of OA equipment and AV devices.

Conventionally liquid crystal display elements containing thin film transistors (TFT) as switching elements are well-known. Many of the liquid crystal display elements configured as above adopt a TN (Twisted Nematic) display mode in which the nematic liquid crystal molecules are twisted about 90° near the electrode substrates or an STN (Super Twisted Nematic) display mode in which those nematic liquid crystal molecules are twisted 180° or more near the electrode substrates.

The aperture ratio greatly affects the display performance of the liquid crystal display elements, such as the light transmittance, power consumption, and viewing angle characteristics.

For example, the use of a transparent-type liquid crystal display element having an active matrix substrate, which will be described in the followings, is suggested for an improvement of the aperture ratio.

Gate signal lines and source signal lines are disposed on the insulating substrate of the active matrix substrate so as to cross each other. A switching element is provided near the crossing points of the gate signal lines and the source signal lines. The switching element is connected at its gate electrode to the gate signal line, and at its source electrode to the source signal line. Moreover, an interlayer insulating film and a pixel electrode are stacked in this sequence to cover the switching element, the gate signal line and the source signal line. The interlayer insulating film is made of a photosensitive organic thin film exhibiting high transmittance in the visual radiation range. The pixel electrode is made of a transparent conductive film. The pixel electrode is connected to the drain electrode of the switching element.

The configuration, in which the interlayer insulating film is formed to separate the gate and source signal lines from the pixel electrode, allows the pixel electrode to be formed so as to overlap the gate and source signal lines, and thereby increases the aperture ratio of the transparent-type liquid crystal display element.

However, those various films composing the active matrix substrate do not exhibit satisfactory adhesion.

For instance, as for the above liquid crystal display element, the cross-sectional structure of the active matrix substrate in its pixel section is insulating substrate/inorganic insulating film/organic insulating film/transparent conductive film/orientation film. Again as for the above the liquid crystal display element, the cross-sectional structure of the active matrix substrate in its sealing section is insulating substrate/inorganic insulating film/organic insulating film/sealing member.

The active matrix substrate configured as above and the liquid crystal display element incorporating this active matrix substrate have a low adhesion strength of about 5 $kg/cm^2$ to 8 $kg/cm^2$. For example, after the active matrix substrate and the liquid crystal display element were preserved for 18 hours in accordance with pressure cooker test (PCT), the films was peeling between the organic insulating film and the transparent conductive film and/or between the organic insulating film and the inorganic insulating film in the sealing section and the pixel section. PCT is a preservation test at a temperature of 121° C., pressure of 2 atm, and humidity of 99%.

Moreover, the films peel also when the transparent conductive film deposited on the organic insulating film is formed into a pattern to form a pixel electrode, since the resin composing the organic insulating film swells with the resist removing liquid (e.g., DMSO).

The peeling, regardless of the kind of the film that peels, shortens the lifetime of and thus decreases the reliability of the display elements such as the liquid crystal display element.

For these reasons, there is a strong demand for a substrate for use in display elements, that exhibits excellent adhesion between the films of which the substrate is composed.

SUMMARY OF THE INVENTION

In view of the problems, some objects of the present invention are to offer a substrate for use in a display element, that exhibits excellent adhesion between the films of which the substrate is composed, and that adds to the reliability of the display element, to offer a method of manufacturing such a substrate, and to offer an apparatus for manufacturing such a substrate.

Another object of the present invention is to offer a substrate for use in a display element having the above features, and an additional feature of giving a high aperture ratio to the display element.

For example, a transparent-type liquid crystal display element incorporating an active matrix substrate configured as below has an improved aperture ratio.

Gate signal lines and source signal lines are disposed on the insulating substrate of the active matrix substrate so as to cross each other. A switching element is provided near the crossing points of the gate signal lines and the source signal lines. The switching element is connected at its gate electrode to the gate signal line, and at its source electrode to the source signal line. Moreover, a pixel electrode is connected to the drain electrode through a connecting electrode composed of a transparent conductive film. An interlayer insulating film is provided to cover the switching element, the gate signal line, the source signal line and the connecting electrode. The interlayer insulating film is made of a photosensitive organic thin film exhibiting high transmittance in the visual radiation range. The pixel electrode is provided on the interlayer insulating film so as to at least partly overlap at least either the gate signal line or the source signal line.

As for the above liquid crystal display element configured as above, the cross-sectional structure of the active matrix substrate in its pixel section is, for instance, insulating substrate/transparent conductive film or inorganic insulating film/organic insulating film/transparent conductive film/ orientation film. Again as for the above the liquid crystal display element, the cross-sectional structure of the active matrix substrate in its sealing section is, for instance, insulating substrate/transparent conductive film or inorganic insulating film/organic insulating film/sealing member.

The configuration, in which the interlayer insulating film is formed to separate the gate and source signal lines from the pixel electrode, allows the pixel electrode to be formed so as to overlap the gate and source signal lines, and thereby increases the aperture ratio of the transparent-type liquid crystal display element. Besides, the configuration, in which the connecting electrode for connecting the drain electrode and the pixel electrode is made of a transparent conductive film, further improves the aperture ratio, compared to conventional configurations.

In addition, the configuration, in which the source signal line has a double-layer structure constituted by the transparent conductive film and the metal layer, can prevent the source signal line from completely being cut off electrically even when the metal layer is partly defective, by allowing the transparent conductive film to maintain the electrical connection.

Nevertheless, if the adhesion between the films composing the active matrix substrate is low, the adoption of such a configuration still have the same conventional problems.

The configuration also has a problem in adhesion between the organic insulating film and, for example, indium tin oxide (ITO), which is a component of the transparent conductive film, and in adhesion between the organic insulating film and a metal such as Ta or Al, which is a component of the metal layer.

If the adhesion of the organic insulating film to the transparent conductive film or to the metal layer is low, for example, in a cleaning process after the contact hole is opened, the cleaning liquid infiltrate through the contact hole to the interface between the organic insulating film and the transparent conductive film, the metal layer, etc., causing the interlayer insulating film that is the organic insulating film to peel. Moreover, the films peel also when the transparent conductive film deposited on the organic insulating film is formed into a pattern to form a pixel electrode, since the resin composing the organic insulating film swells with the resist removing liquid (e.g., DMSO).

Accordingly, in order to obtain a highly reliable display element, it is very important to improve the adhesion between films composing a substrate for use in a display element incorporated in the display element, especially a substrate including a configuration in which the organic insulating film is disposed adjacently to the inorganic insulating film or to the transparent conductive film.

Accordingly, in order to accomplish the objects, the substrate for use in a display element in accordance with the present invention is characterized in that a second film (e.g., an organic insulating film) is deposited on a first film (e.g., an inorganic insulating film and/or an ITO film that is a transparent insulating film) that has a surface processed with vacuum ultraviolet light.

Alternatively, in order to accomplish the objects, the substrate for use in a display element in accordance with the present invention is characterized in that a second film is deposited on a first film that has a surface processed with ultraviolet light in an atmosphere of ozone.

In order to accomplish the objects, the method of manufacturing a substrate for use in a display element in accordance with the present invention is characterized in that it includes the steps of: (a) processing a surface of a first film with vacuum ultraviolet light; and (b) depositing a second film on the first film.

Alteratively, in order to accomplish the objects, the method of manufacturing a substrate for use in a display element in accordance with the present invention is characterized in that it includes the steps of: (a) processing a surface of a first film with ultraviolet light in an atmosphere of ozone; and (b) depositing a second film on the first film.

In order to accomplish the objects, the apparatus for manufacturing a substrate for use in a display element in accordance with the present invention is characterized in that it incorporates a device for processing with vacuum ultraviolet light including vacuum ultraviolet light emitting section (e.g., excimer lamp as a vacuum ultraviolet light generating section) for irradiating with vacuum ultraviolet light a material member to be processed into said substrate.

Alternatively, in order to accomplish the objects, the apparatus for manufacturing a substrate for use in a display element in accordance with the present invention is characterized in that it incorporates a device for processing with ultraviolet light including: ultraviolet light emitting section (e.g., a low-pressure mercury lamp as an ultraviolet light generating section) for irradiating with ultraviolet light a material member to be processed into said substrate; and an ozone generating section (e.g., an ozone generating device) for creating an atmosphere of ozone in an area that is to be irradiated with ultraviolet light emitted by the ultraviolet light emitting section.

It is possible to offer a substrate for use in a display element exhibiting excellent adhesion between the films by processing the surface of the first film, that is a material for the substrate for use in a display element, with vacuum ultraviolet light or ultraviolet light in a atmosphere of ozone as described above. Therefore, the use of the substrate for use in a display element adds to the reliability of the display element.

A substrate for use in a display element configured as above boasts very excellent adhesion between the films composing the substrate for use in a display element. For example, even after the substrate for use in a display element or a display element incorporating the substrate for use in a display element has been preserved for 24 hours under the conditions of a temperature of 121° C., pressure of 2 atm, and humidity of 99%, the films do not peel in the pixel section nor in the sealing section in a case where the display element is formed.

That is, the organic insulating film can be prevented from peeling by, for example, processing the surface of a first film, i.e., a film adjacent to the organic insulating film, with vacuum ultraviolet light or with ultraviolet light in an atmosphere of ozone. The first film is, for example, the inorganic insulating film in this case, and is the inorganic insulating film and the transparent conductive film in a case where a connecting electrode composed of a transparent conductive film is provided. Besides, according to the above method, even if the substrate for use in a display element is soaked in an organic solvent in the manufacturing process, the organic insulating film does not peel by swelling.

Alternatively, in order to accomplish the objects, the substrate for use in a display element in accordance with the present invention is characterized in that it includes: an organic insulating film (e.g., the interlayer insulating film); and at least either an inorganic insulating film (e.g., the gate insulating film) or a transparent conductive film (e.g., the connecting electrode and/or the pixel electrode), wherein the organic insulating film firmly adheres to at least either the inorganic insulating film or the transparent conductive film with a silane compound.

In order to accomplish the objects, the method of manufacturing a substrate for use in a display element in accordance with the present invention is characterized in that it includes the step of processing at least one kind of film selected from the group consisting of the organic insulating film (e.g., the interlayer insulating film), the inorganic insulating film (e.g., the gate insulating film), and the transparent conductive film (e.g., the connecting electrode) with the silane compound.

In order to accomplish the objects, the apparatus for manufacturing a substrate for use in a display element in accordance with the present invention is characterized in that it incorporates a device for processing with a silane compound including a chamber provided with an inflow port through which a gas containing the silane compound flows in.

The configuration, in which at least one kind of film selected from the group consisting of the organic insulating film, the inorganic insulating film, and the transparent conductive film is processed with a silane compound, can offer a substrate for use in a display element that boasts excellent adhesion (adhesion strength) of the organic insulating film to the inorganic insulating film and/or to the transparent conductive film that are in contact with the organic insulating film, that is, excellent adhesion between the films composing the substrate. Therefore, a highly reliable display element can be hence obtained by using the substrate for use in a display element.

A substrate for use in a display element configured as above boasts very excellent adhesion of the organic insulating film to the inorganic insulating film, the transparent conductive film, etc. For example, even after the substrate for use in a display element or a display element incorporating the substrate for use in a display element has been preserved for 24 hours under the conditions of a temperature of 121° C., pressure of 2 atm, and humidity of 99%, the films do not peel in the pixel section nor in the sealing section in a case where the display element is formed. Besides, even if the substrate for use in a display element is soaked in an organic solvent, the organic insulating film does not peel by swelling.

In addition, the use of the manufacturing apparatus enables the silane compound to efficiently adhere to the surface of, for example, the organic insulating film, the inorganic insulating film, the transparent conductive film, etc. composing the substrate for use in a display element. The adhesion of the silane compound to the surface of the organic insulating film, the inorganic insulating film or the transparent conductive film in this manner improves adhesion between the transparent conductive film, the inorganic insulating film, etc. and the organic insulating film deposited on the transparent conductive film, the inorganic insulating film, etc., and thereby offers a highly reliable substrate for use in a display element.

For a fuller understanding of the nature and advantages of the invention, reference should be made to the ensuing detailed description taken in conjunction with the accompanying drawings.

DESCRIPTION OF THE EMBODIMENTS

Referring to FIGS. 1 through 10, the following description will discuss an embodiment in accordance with the present invention.

Figure 1:
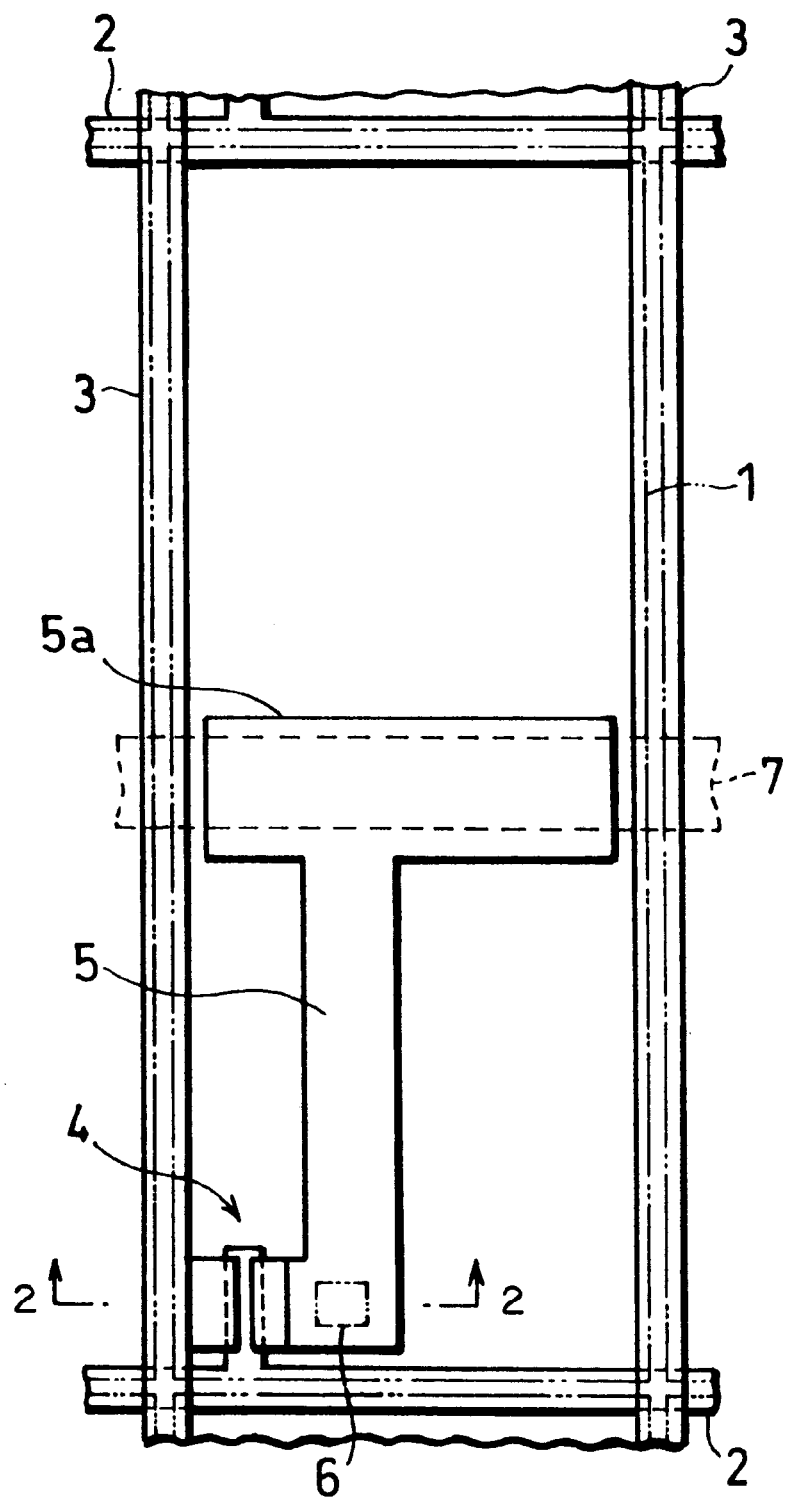
FIG. 1 is a plan view schematically showing a pixel part of an active matrix substrate as a substrate for use in a display element of an embodiment in accordance with the present invention, a pixel electrode being shown in a alternate long and two short dashes lines.
Figure 2:
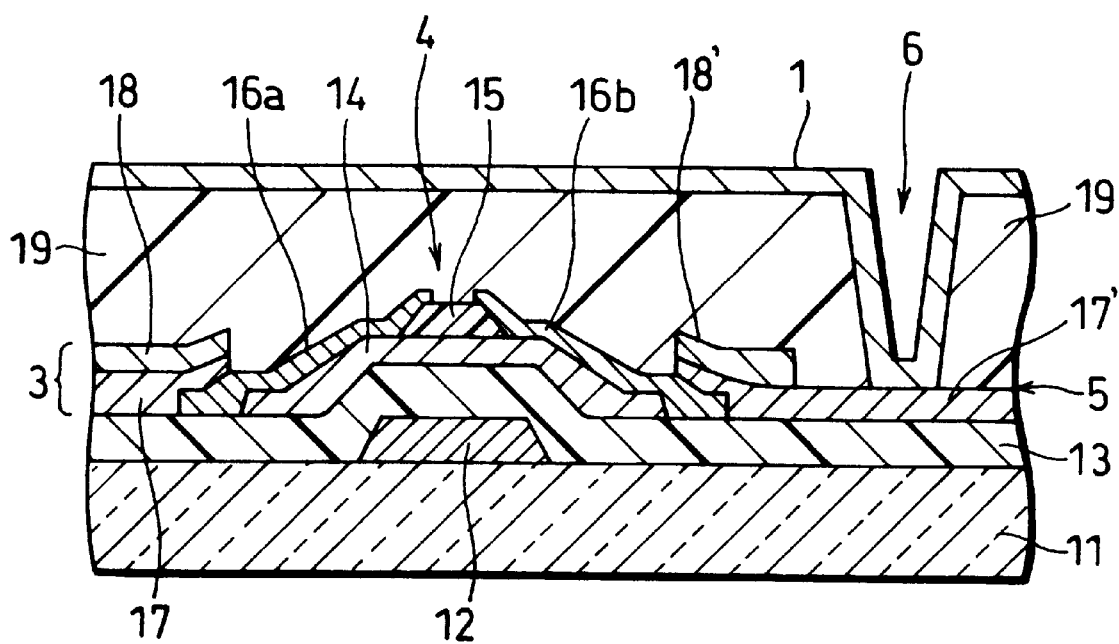
FIG. 2 is a cross-sectional view, of the active matrix substrate shown in FIG. 1, taken along line A—A.

First, referring to FIGS. 1 and 2, the following description will explain an overall configuration of an active matrix substrate as a substrate for use in a display element of the present embodiment, and a liquid crystal display element as a display element incorporating the active matrix substrate.

As shown in FIG. 1, a plurality of pixel electrodes 1 are disposed on a active matrix substrate in a matrix form. A gate signal line 2 as a scanning line and a source signal line 3 as a signal line are provided around the pixel electrode so as to cross each other at right angles (overlaps each other) in a peripheral part of the pixel electrode 1. A thin film transistor (TFT) 4 as a switching element connected to the pixel electrode 1 is provided where the gate signal line 2 crosses the source signal line 3. The gate signal line 2 is connected to, and thus transmits scanning signals to, the gate electrode of the TFT 4. The source signal line 3 is connected to, and thus transmits data signals to, the source electrode of the TFT 4. The drain electrode of the TFT 4 is connected to the pixel electrode 1 through a connecting electrode 5 and a contact hole 6, and is also connected to an electrode 5a, one of the two electrodes of an additional capacity of the pixel, through the connecting electrode 5. The other electrode 7 of the additional capacity is connected to an opposite electrode (not shown) provided on an opposite substrate.

To form the active matrix substrate, first, the gate signal line 2 and the electrode 7 of the additional capacity are formed parallel to each other on a transparent insulating substrate 11 as shown in FIG. 1. The gate electrode of the TFT 4 is formed at the same time as is the gate signal line 2.

The TFT 4 has a configuration shown in FIG. 2, in which a gate electrode 12, a gate insulating film 13 made of an inorganic insulating film, a semiconductor layer 14, a channel protecting layer 15, an n$^+$Si layer serving as a source electrode 16$a$ and a drain electrode 16$b$ are sequentially deposited with a conventional method on the transparent insulating substrate 11 made of glass and the like.

In the configuration, the gate electrode 12 is connected to the gate signal line 2 shown in FIG. 1. The gate insulating film 13 is disposed on the insulating substrate 11 in such a manner to cover the gate electrode 12. The semiconductor layer 14 is so disposed on the gate insulating film 13 to overlie the gate electrode 12 via the gate insulating film 13. The channel protecting layer 15 is disposed on a central part of the semiconductor layer 14. The n$^+$Si layer is so disposed on the gate insulating film 13 to over the semiconductor layer 14 and both edges of the channel protecting layer 15 and to be divided into two parts on top of the channel protecting layer 15.

A metal layer 18' and a transparent conductive film 17' that is a first transparent conductive film are disposed on an edge of the drain electrode 16$b$ that is one of the two parts into which the n$^+$Si layer is divided on top of the channel protecting layer 15 of the TFT 4. The transparent conductive film 17' is extended, connecting the drain electrode 16$b$ to the pixel electrode 1 and forming the connecting electrode 5 connected to the electrode 5$a$ of the additional capacity. A metal layer 18 and a transparent conductive film 17 that forms the source signal line 3 are disposed on an edge of the source electrode 16$a$ that is the other part of the two into which the n$^+$Si layer is divided on top of the channel protecting layer 15.

In the present embodiment, as described so far, the source signal line 3 has a double-layer structure, constituted by the transparent conductive film 17 and the metal layer 18. The structure is useful in that it prevents the source signal line 3 from completely being cut off electrically even when the metal layer 18 is partly defective, by allowing the transparent conductive film 17 to maintain the electrical connection.

An interlayer insulating film 19 made of an organic insulating film is provided on the TFT 4, the gate signal line 2, the source signal line 3 and the connecting electrode 5. The contact hole 6 is formed on the connecting electrode 5 so as to penetrate the interlayer insulating film 19. To form the contact hole 6 on the active matrix substrate, first, for example, a photosensitive acrylic resin film, as a material for the interlayer insulating film 19, of 3 μm in thickness is formed on the TFT 4, the gate signal line 2, the source signal line 3 and the connecting electrode 5 with, for example, a spin coating method. Next, the acrylic resin is exposed to light according to a desired pattern, and developed with an alkaline solution. In this manner, only the exposed part of the interlayer insulating film 19 is etched with the alkaline solution, and the contact hole 6 penetrating the interlayer insulating film 19 is formed. Subsequently, the pixel electrode 1 is formed on the interlayer insulating film 19 by depositing a transparent conductive film with sputtering method and then by forming it into a desired pattern.

The pixel electrode 1 is connected by the transparent conductive film 17' that acts as the connecting electrode 5 to the drain electrode 16$b$ of the TFT 4 through the contact hole 6 penetrating the interlayer insulating film 19 as shown in FIGS. 1 and 2. An orientation film 20 (see FIG. 11) is formed on the Vi pixel electrode 1 of the active matrix substrate.

The active matrix substrate is fabricated by the process described above, in which the TFTs 4 as switching elements are arranged in a matrix form, and the gate signal lines 2 for supplying scanning signals to the TFTs 4 cross the source signal lines 3 for supplying data signals to the TFTs 4 at right angles.

The configuration, in which the interlayer insulating film 19 is formed to separate the gate signal line 2 and the source signal line 3 from the pixel electrode 1, can improve the aperture ratio, and allow the pixel electrode 1 to overlap the gate signal line 2 and the source signal line 3. In this manner, the electric field generated by the signal lines can be shielded, and the inappropriate orientation of the liquid crystal can be restrained. Besides, the aperture ratio can be further improved, compared to conventional configurations, since the connecting electrode 5 for connecting the drain electrode 16$b$ and the pixel electrode 1 is made of a transparent conductive film.

Figure 11:
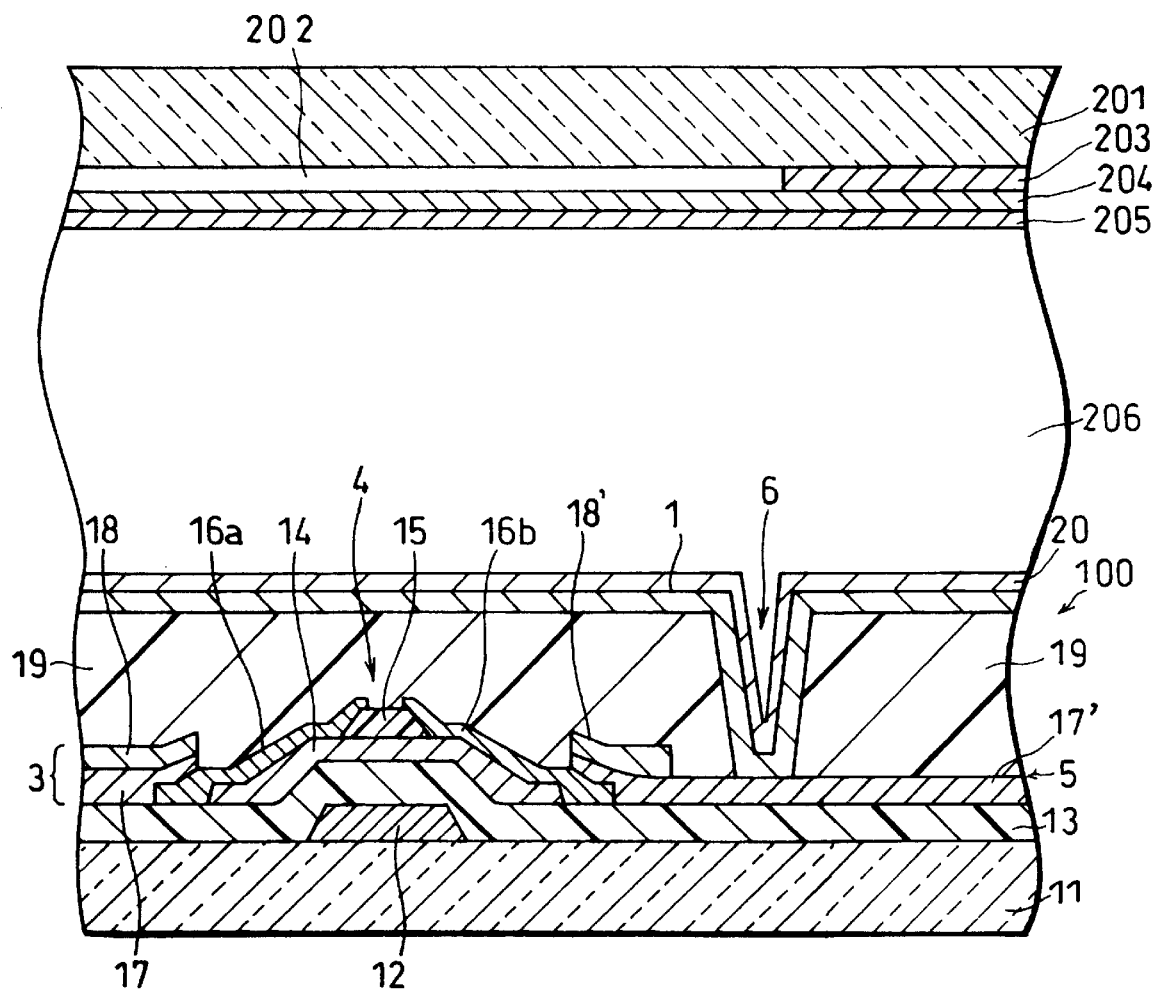
FIG. 11 is a simplified cross-sectional view schematically showing a structure of a liquid crystal display element incorporating the active matrix substrate.

As shown in FIG. 11, a liquid crystal display element is formed by combining the active matrix substrate 100 and the opposite substrate 200 composed of a black matrix 202, a color filter 203, an opposite electrode 204, and an orientation film 205 that are sequentially deposited on a surface of a transparent insulating substrate 201, and then introducing liquid crystal 206 into the space between the active matrix substrate and the opposite substrate.

The active matrix substrate 100 thus obtained has, in its pixel section, a cross-sectional structure of, for example, insulating substrate 11/transparent conductive film 17' or gate insulating film 13/interlayer insulating film 19/pixel electrode 1/orientation film 20, and has, in its sealing section in the process of forming the liquid crystal display element, a cross-sectional structure of insulating substrate 11/transparent conductive film 17' or gate insulating film 13/interlayer insulating film 19/sealing member.

In the present invention, the material for the interlayer insulating film 19 is preferably a photosensitive polymer. The use of a photosensitive polymer as a resin constituting the interlayer insulating film 19 enables the patterning step of forming the contact hole 6 to be completed only by the exposure, thereby facilitating the processing. In addition, since the pixel electrode 1, the interlayer insulating film 19 and the TFT 4 as a switching element generate a parasitic capacity, the interlayer insulating film 19 of the active matrix substrate 100 preferably has a thickness of 1.5 μm or more. The parasitic capacity can be suppressed by setting the thickness of the interlayer insulating film 19 to 1.5 μm or more. As a result, a liquid crystal display element incorporating such a configuration can achieve good display quality.

The photosensitive polymer used in the present invention is preferably transparent in the visual radiation range, and exhibits a transmittance of 90% or higher in the visual radiation range. The photosensitive polymer, although not restricted in a particular manner, is preferably composed of at least one resin selected from the group consisting of epoxy resins, phenol resins, urethane resins, polyimides, polyesters, rubbers, diallylphthalate resins, polypropylenes, ethylene propylene diene methylene (EPDM) resins, melamine resins, and acrylonitrile butadiene styrene (ABS) resins, and vinyl chloride photosensitive polymers.

Alternatively the photosensitive polymer may be composed of a photosensitive agent and a base polymer. Examples of negative base polymers include epoxyacrylate resins and styrene polymers such as chloromethylated polystyrene, chloromethylated poly(α-methylstyrene), poly (chloro α-methylstyrene), polychloromethylstyrene, and polyhalogenostyrene. Examples of positive base polymers include polyglycidyl methacrylates and polymethyl methacrylates. Examples of positive photosensitive agents include naphthoquinone diazides. Examples of negative photosensitive agents include diazonium salt compounds. Epoxyacrylate resins, polyglycidyl methacrylates and styrene polymers are preferred to the others among the above-listed photosensitive polymers, since they are transparent in the visual radiation range.

Even if the photosensitive polymer constituting the interlayer insulating film 19 is colored, the color of the photosensitive agent used for the photosensitive polymer can be eliminated by, for example, irradiating the photosensitive agent with ultraviolet light after forming the photosensitive polymer into a desired pattern, thereby improving the transmittance of the interlayer insulating film 19 in the visual radiation range.

If such an interlayer insulating film 19 with an improved aperture ratio is formed between the gate signal line 2 and the pixel electrode 1 and between the source signal line 3 and the pixel electrode 1, satisfactory adhesion is not obtained, especially, between the interlayer insulating film 19 that is an organic insulating film and the gate insulating film 13 that is an inorganic insulating film, for example, the transparent conductive films 17 and 17' that are transparent conductive films, etc.

In this case, a method of improving the adhesion between the organic insulating film and the inorganic insulating film, the transparent conductive films, etc. is to clean the surfaces of the transparent conductive films, the inorganic insulating film, etc.

For this reason, in the present invention, if the gate insulating film 13, the transparent conductive films 17 and 17', etc. are deposited, after the deposition of the gate insulating film 13, the transparent conductive films 17 and 17', etc., the surfaces of the gate insulating film 13, the transparent conductive films 17 and 17', etc. are cleaned to improve the adhesion between the gate insulating film (first film) 13, the transparent conductive films (first films) 17 and 17', etc. and the interlayer insulating film (second film) 19. The process proceeds to a next step after the cleaning is completed.

Although conventionally not used for the purpose of improving the adhesion of various films constituting a substrate for use in a display element, it is known that light of primarily 185 nm and 254 nm radiating from a low-pressure mercury lamp can be used to clean a substrate (e.g., insulating substrate).

The cleaning mechanism using a low-pressure mercury lamp is given by:

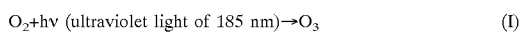
$O_2+h\nu$ (ultraviolet light of 185 nm)$\rightarrow O_3$ (I)

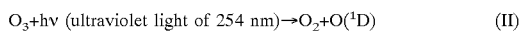
$O_3+h\nu$ (ultraviolet light of 254 nm)$\rightarrow O_2+O(^1D)$ (II)

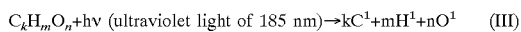
$C_kH_mO_n+h\nu$ (ultraviolet light of 185 nm)$\rightarrow kC^1+mH^1+nO^1$ (III)

$kC^1+mH^1+nO^1+O(^1D)\rightarrow aCO+bCO_2+cH_2O$ (IV)

First, as shown by General Formula (I), oxygen in air absorbs ultraviolet light of 185 nm and forms ozone. Next, as shown by General Formula (II), the ozone absorbs ultraviolet light of 254 nm and forms excited oxygen atoms. Then, as shown by General Formula (III), an organic substance sticking to, for example, the substrate is decomposed by ultraviolet light that has a short wavelength of 185 nm, and hence a large amount of photon energy. Finally, the decomposed substances change into volatile substances such as carbo dioxide and water, as they react with the excited oxygen atoms that are very oxidizing.

However, simply cleaning with the low-pressure mercury lamp does not sufficiently improve the adhesion between the organic insulating film and the inorganic insulating film, the transparent conductive films, etc. The inorganic insulating film, the transparent conductive films, etc. that are irradiated with the light of the low-pressure mercury lamp and then cleaned in pure water show little improvement in the adhesion with the organic insulating film.

In the present invention, the surfaces of the gate insulating film 13, the transparent conductive films 17 and 17', etc. are cleaned with a large number of excited oxygen atoms generated by radiation of vacuum ultraviolet light, ultraviolet light in the presence of enough ozone to create an atmosphere of ozone, or the like. The two factors, i.e., the concentration of the excited oxygen atoms and the light radiation intensity, dictate the thoroughness in cleaning, smoothness, and cleaning speed of the film surfaces. Oxygen atoms transit into an excited state with a wavelength of 147 nm, and ozone transits into an excited state with a wavelength of 220 to 310 nm. Therefore, to increase the number of transitions to the excited state and to thereby improve the quantum efficiency, vacuum ultraviolet light and ultraviolet light to be used preferably have a wavelength as close to those wavelength ranges as possible.

If vacuum ultraviolet light is used to generate the excited oxygen atoms, for example, a dielectric barrier discharging excimer lamp filled with xenon gas can be used. Light radiating from the excimer lamp has an emission line of about 100 nm in width and 172 nm in peaktop.

The cleaning mechanism using an excimer lamp is given by:

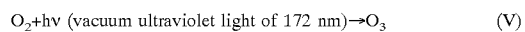
$O_2+h\nu$ (vacuum ultraviolet light of 172 nm)$\rightarrow O_3$ (V)

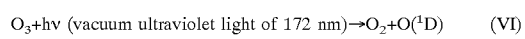
$O_3+h\nu$ (vacuum ultraviolet light of 172 nm)$\rightarrow O_2+O(^1D)$ (VI)

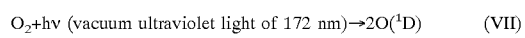
$O_2+h\nu$ (vacuum ultraviolet light of 172 nm)$\rightarrow 2O(^1D)$ (VII)

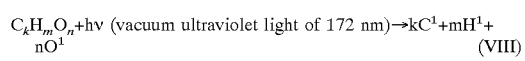
$C_kH_mO_n+h\nu$ (vacuum ultraviolet light of 172 nm)$\rightarrow kC^1+mH^1+nO^1$ (VIII)

$kC^1+mH^1+nO^1+O(^1D)\rightarrow aCO+bCO_2+cH_2O$ (IX)

In the above step of cleaning, the central wavelength of the excimer lamp is an emission line of 172 nm as described above. Vacuum ultraviolet light simultaneously performs the process of generating ozone by being absorbed by oxygen in air and eventually generating excited oxygen atoms and the process of directly generating excited oxygen atoms by being absorbed by oxygen in air.

To be more specific, in the above mechanism of cleaning, on one hand, first, as shown by General Formula (V), oxygen in air absorbs vacuum ultraviolet light of 172 nm and generates ozone. Then, as shown by General Formula (VI), that ozone absorbs vacuum ultraviolet light of 172 nm and generates excited oxygen atoms. On the other hand, as shown by General Formula (VII), oxygen in air absorbs vacuum ultraviolet light of 172 nm and directly generates excited oxygen atoms. Then, the very oxidizing excited oxygen atoms change, as shown by General Formula (IX), into volatile substances such as carbo dioxide and water, as they react with the decomposed substances formed, as shown by General Formula (VIII), by the decomposition of an organic substance sticking to, for example, the substrate by vacuum ultraviolet light of 172 nm having a large amount of photon energy.

The cleaning mechanism using an excimer lamp includes the same steps of decomposing the organic substance sticking to, for example, the substrate and of changing it into volatile substances as does the cleaning mechanism using a low-pressure mercury lamp. However, vacuum ultraviolet light has a larger amount of photon energy, and hence a better efficiency in generating excited oxygen atoms than does the low-pressure mercury lamp. Therefore, when the surfaces of the gate insulating film 13, the transparent conductive films 17 and 17', etc. are cleaned with vacuum ultraviolet light, especially, with vacuum ultraviolet light radiating from an excimer lamp, the thoroughness in cleaning, smoothness, and cleaning speed of the film surfaces are improved, in comparison to the use of a low-pressure mercury lamp.

The excimer lamp is superior to the low-pressure mercury lamp as follows:

(1) The excimer lamp exhibits a cleaning speed ten times faster than a high-powered low-pressure mercury lamp.

(2) The excimer lamp emits a homogeneous light having a luminescent wavelength of 172 nm, which is in the range of vacuum ultraviolet light. Such light travels in vacuum, but does not travel well in the atmosphere, and therefore is safe to a human body unless he/she is in an extreme close proximity of the lamp.

(3) The excimer lamp can be instantly switched ON and switched ON/OFF with power consumption one-third that of the low-pressure mercury lamp.

There are no particular conditions for, for example, processing the surfaces of the gate insulating film 13, the transparent conductive films 17 and 17', etc. with vacuum ultraviolet light. Neither are there any restrictions on the processing method.

Figure 3:
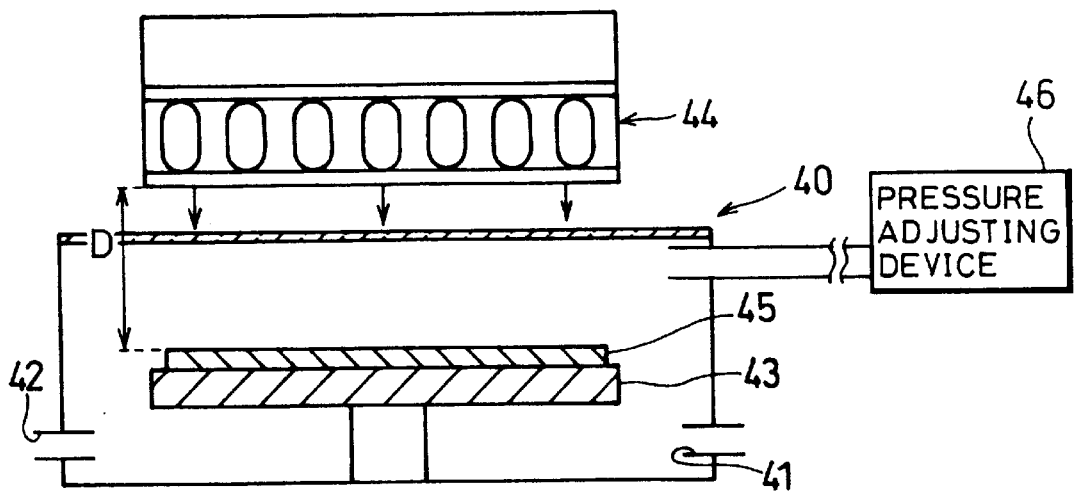
FIG. 3 is a simplified cross-sectional view showing a device for processing with vacuum ultraviolet light, installed in an apparatus for manufacturing a substrate for use in a display element in accordance with the present invention.

If the surfaces of the gate insulating film 13, the transparent conductive films 17 and 17', etc. are processed with vacuum ultraviolet light, they are preferably processed with, for example, an apparatus for manufacturing a substrate for use in a display element, that incorporates a device for processing with vacuum ultraviolet light, as substrate surface processing means (substrate surface processing device; substrate cleaning means) shown in FIG. 3. The device for processing with vacuum ultraviolet light includes at least a vacuum ultraviolet light generator 44, and further includes a duct-equipped chamber 40. The duct-equipped chamber 40 has ventilation ducts 41 and 42 through which ozone can freely flows in and out, and a movable stage (vacuum ultraviolet light radiation distance adjusting section) 43 on which the substrate for use in a display element is placed. The vacuum ultraviolet light generator 44 acts as vacuum ultraviolet light emitting section for irradiating the substrate for use in a display element with vacuum ultraviolet light. Preferably, for example, the above described excimer lamp is used as the vacuum ultraviolet light generator 44, although the vacuum ultraviolet light generator 44 is not restricted in a particular manner as long as it is capable of generating vacuum ultraviolet light.

The vacuum ultraviolet light generator 44 may be installed either inside or outside the duct-equipped chamber 40. However, the vacuum ultraviolet light generator 44 is preferably installed outside the duct-equipped chamber 40. By installing the vacuum ultraviolet light generator 44 outside the duct-equipped chamber 40, the processing with vacuum ultraviolet light can be performed, for example, while the inside of the duct-equipped chamber 40 is depressurised by a pressure adjusting device (pressure adjusting means) 46.

If the vacuum ultraviolet light generator 44 is installed outside the duct-equipped chamber 40, as shown in FIG. 3, the surface, of the duct-equipped chamber 40, opposite to the vacuum ultraviolet light generator 44 is made of a light transmitting material that lets vacuum ultraviolet light travel into the duct-equipped chamber 40.

The light transmitting material is not restricted in a particular manner as long as it is capable of transmitting vacuum ultraviolet light. A preferred example of such materials is quartz.

When the device for processing with vacuum ultraviolet light is used for radiation of vacuum ultraviolet light, first, a substrate 45 as a member to be processed (e.g., the transparent insulating substrate 11 on which the gate insulating film 13 or transparent conductive films 17 and 17' is/are already formed) is placed on the movable stage 43. The distance, D, between the vacuum ultraviolet light generator 44 and the surface of the substrate 45 is adjusted by vertically moving the movable stage 43 with a moving system (not shown). Thereafter, the surface of the substrate 45 is cleaned by being irradiated with vacuum ultraviolet light radiating from the vacuum ultraviolet light generator 44.

In this case, the cleaning speed of the substrate 45 depends on the vacuum ultraviolet light radiation intensity, the radiation distance from the vacuum ultraviolet light generator 44, and the quantity of the excited oxygen atoms. Then, the distance, D, between the vacuum ultraviolet light generator 44 and the surface of the substrate 45, although not restricted in a particular manner, is preferably $0 \text{ mm} < D \leq 20 \text{ mm}$, and is more preferably $0 \text{ mm} < D \leq 6 \text{ mm}$. The distance D is preferably as short as possible if outside air can be replaced.

In addition, an ozone generating device (not shown) may be provided to the device for processing with vacuum ultraviolet light for the purpose of further increasing the concentration of ozone. The preferred concentration of ozone (amount of generated ozone), although variable depending on the kind (material) of the film to be cleaned, is 40 mg/min or higher.

If ultraviolet light is used to generate the excited oxygen atoms, ultraviolet light to be used preferably has a wavelength as close to the above detailed wavelength ranges as possible, and is emitted in an atmosphere of ozone. This is because the two factors, i.e., the concentration of the excited oxygen atoms and the light radiation intensity, dictate the thoroughness in cleaning, smoothness, and cleaning speed of the film surface, and hence, raising the concentration of ozone is very effective in raising the concentration of the oxygen atoms.

If vacuum ultraviolet light is used to generate the excited oxygen atoms, for example, the above described low-pressure mercury lamp can be also used. However, an atmosphere of ozone needs to be created with, for example, an ozone generating device, in which ultraviolet light is emitted. The preferred amount of the generated ozone in this case, although variable depending on the kind (material) of the film to be cleaned, is 40 mg/min or higher. If the amount of the generated ozone is less than 40 mg/min, the adhesion between the gate insulating film 13, the transparent conductive films 17 and 17', etc. and the interlayer insulating film 19 is possibly not improved sufficiently.

The cleaning mechanism when the low-pressure mercury lamp is used for the above meticulous cleaning is already described in the above. However, by emitting ultraviolet light in an atmosphere of ozone, it is possible to generate the excited oxygen atoms more efficiently, and to improve the thoroughness in cleaning, smoothness, and cleaning speed of the surfaces of the gate insulating film 13, the transparent conductive films 17 and 17', etc., compared to a case when the low-pressure mercury lamp is simply used.

Figure 4:
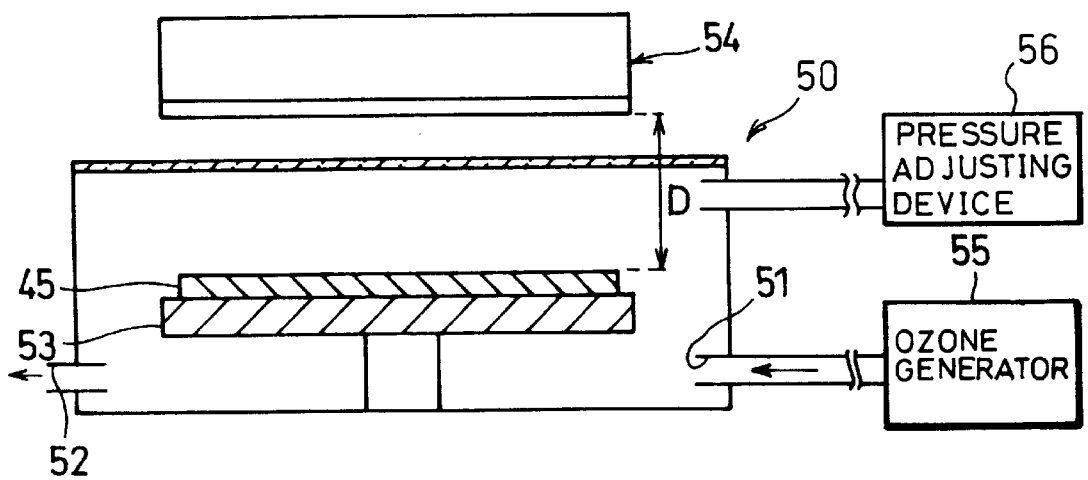
FIG. 4 is a simplified cross-sectional view showing a device for processing with ultraviolet light, installed in another apparatus for manufacturing a substrate for use in a display element in accordance with the present invention.

If the surfaces of the gate insulating film 13, the transparent conductive films 17 and 17', etc. are processed with ultraviolet light, they are preferably processed with, for example, an apparatus for manufacturing a substrate for use in a display element, that incorporates a device for processing with ultraviolet light, as substrate surface processing means (substrate surface processing device; substrate cleaning means) shown in FIG. 4. The device for processing with ultraviolet light includes at least an ultraviolet light generator 54 and an ozone generating device 55, and further includes a duct-equipped chamber 50. The duct-equipped chamber 50 has ventilation ducts 51 and 52 through which ozone can freely flows in and out, and a movable stage 53 on which the substrate for use in a display element is placed. The ultraviolet light generator 54 acts as ultraviolet light emitting section for irradiating the substrate for use in a display element with ultraviolet light. Preferably, for example, the above described low-pressure mercury lamp is used as the ultraviolet light generator 54, although the ultraviolet light generator 54 is not restricted in a particular manner as long as it is capable of generating ultraviolet light. The ozone generating device 55 acts as an ozone generating section for creating an atmosphere of ozone in the area that is to be irradiated with ultraviolet light emitted by the ultraviolet light generator 54.

The ultraviolet light generator 54 may be installed either inside or outside the duct-equipped chamber 50, as may the vacuum ultraviolet light generator 44. However, the ultraviolet light generator 54 is preferably installed outside the duct-equipped chamber 50. By installing the ultraviolet light generator 54 outside the duct-equipped chamber 50, the processing with vacuum ultraviolet light can be performed, for example, while the inside of the duct-equipped chamber 50 is depressurised by a pressure adjusting device (pressure adjusting means) 56.

If the ultraviolet light generator 54 is installed outside the duct-equipped chamber 50, as shown in FIG. 4, the surface, of the duct-equipped chamber 50, opposite to the ultraviolet light generator 54 is made of a light transmitting material that lets ultraviolet light travel into the duct-equipped chamber 50.

The light transmitting material is not restricted in a particular manner as long as it is capable of transmitting ultraviolet light. A preferred example of such materials is quartz.

When the device for processing with ultraviolet light is used for radiation of ultraviolet light, first, a substrate 45 as a member to be processed (e.g., the transparent insulating substrate 11 on which the gate insulating film 13 or transparent conductive films 17 and 17' is/are already formed) is placed on the movable stage (ultraviolet light radiation distance adjusting section) 53. Then, the distance, D, between the ultraviolet light generator 54 and the surface of the substrate 45 is adjusted by vertically moving the movable stage 53 with a moving system (not shown). Thereafter, the surface of the substrate 45 is cleaned by introducing ozone generated by the ozone generating device 55 into the duct-equipped chamber 50 via the ventilation duct 51, and then irradiating the surface of the substrate 45 with ultraviolet light radiating from the ultraviolet light generator 54.

The distance, D, between the ultraviolet light generator 54 and the surface of the substrate 45 is preferably 0 mm<D≦20 mm, and is more preferably 0 mm<D≦6 mm, as is the distance, D, between the vacuum ultraviolet light generator 44 and the surface of the substrate 45.

As described so far, when the surfaces of the gate insulating film 13, the transparent conductive films 17 and 17', etc. are cleaned, it is possible to improve the thoroughness in cleaning, smoothness, etc. of the surfaces of the gate insulating film 13, the transparent conductive films 17 and 17l, etc., compared to a case when such processing is not carried out, by performing the cleaning process using vacuum ultraviolet light, or by performing the cleaning process using ultraviolet light in an atmosphere of ozone. As a result, the adhesion (adhesion strength) between the gate insulating film 13, the transparent conductive films 17 and 17', etc. and the interlayer insulating film 19, the metal layers 18 and 18', etc. can be improved, and a highly reliable active matrix substrate 100 can be obtained. In addition, with the above methods, it is possible to clean the substrate in a short time, to cut down energy consumption and to enhance safety.

Moreover, as described so far, the substrate 45 can be cleaned uniformly, and also the concentration of ozone in the chamber 40 or in the chamber 50 can be raised, by performing the cleaning process using vacuum ultraviolet light in the device for processing with vacuum ultraviolet light, or by performing the cleaning process using ultraviolet light in an atmosphere of ozone in the device for processing with ultraviolet light. Therefore, the use of the apparatus for manufacturing a substrate for use in a display element enables the processing of the surfaces of the gate insulating film 13, the transparent conductive films 17 and 17', etc. to be performed more efficiently and easily.

If the cleaning process using vacuum ultraviolet light or ultraviolet light is applied to the insulating substrate 11, the adhesion between the insulating substrate 11 and the gate insulating film 13 is improved. Also, if the cleaning process using vacuum ultraviolet light or ultraviolet light is applied to the pixel electrode 1, the adhesion between the pixel electrode 1 and, for example, an orientation film 20 disposed on the pixel electrode 1 is improved.

In addition, ashing treatment of the interlayer insulating film 19 with, for example, the excimer lamp is preferred, for example, in order to prevent inappropriate conductance of the contact hole 6 caused by the interlayer insulating film 19 that is left unremoved from where the contact hole 6 is supposed to be formed as a result of improper exposure or improper development after the forming of the interlayer insulating film 19, or in order to improve the adhesion between the interlayer insulating film 19 and the pixel electrode 1 by changing the properties of the surface of the interlayer insulating film 19. Ashing treatment can improve the adhesion, since ashing treatment changes properties of the surface, increases the roughness, and hence increases the surface area.

The first film is not limited to the gate insulating film 13, the transparent conductive films 17 and 17', etc. In the present invention, the first film to be processed can be any film on which another film is deposited adjacently and which is made of a material which can be processed with vacuum ultraviolet light or ultraviolet light.

Besides, the adhesion between the first and second films (e.g., between the gate insulating film 13, the transparent conductive films 17 and 17', etc. and the interlayer insulating film 19) can be further improved by cleaning the gate insulating film 13, the transparent conductive films 17 and 17', etc. in pure water and/or an organic solvent, depending upon the material of the film to be processed, after the cleaning process using vacuum ultraviolet light or ultraviolet light. The organic solvent, although not restricted in a particular manner, is preferably isopropyl alcohol (IPA).

In this case, if the film to be processed is made of ITO, the film is preferably cleaned in pure water after the cleaning process using vacuum ultraviolet light or ultraviolet light, and is more preferably cleaned and dried with IPA after being cleaned in pure water. The transparent conductive films 17 and 17' and the interlayer insulating film 19 that have undergone the cleaning process in pure water and the cleaning and drying process with IPA exhibit better adhesion than those that have not undergone the processes, regardless of the conditions of preservation.

By contrast, if the film to be processed is made of SiNx, the gate insulating film 13 and the interlayer insulating film 19 that have not undergone pressure cooker test (PCT) exhibit better adhesion in the case of having undergone the cleaning and drying process with IPA after the cleaning process using vacuum ultraviolet light or ultraviolet light than in the case of not having undergone the cleaning and drying process with IPA.

The active matrix substrate 100 obtained as above and the liquid crystal display element incorporating this active matrix substrate 100 have an adhesion strength of at least 10 kg/cm$^2$, and more specifically, 10 kg/cm$^2$ to 20 kg/cm$^2$, which is a great improvement on the conventionally available adhesion strength. Even after the active matrix substrate 100 and the liquid crystal display element are preserved for 24 hours in accordance with pressure cooker test (PCT), no films peel between the gate insulating film 13 and the interlayer insulating film 19 and between the transparent conductive films 17 and 17' and the interlayer insulating film 19 in the sealing section and the pixel section. Moreover, the interlayer insulating film 19 neither swells nor peels, for example, in the cleaning step after the forming of the contact hole 6, not damaging the performance of the active matrix substrate 100 and the liquid crystal display element. The configuration hence allows the active matrix substrate 100 to be highly durable and reliable.

Another method of improving the adhesion between the gate insulating film 13, the transparent conductive films 17 and 17', etc. and the interlayer insulating film 19 is to process the gate insulating film 13, the transparent conductive films 17 and 17', etc. or the interlayer insulating film 19 with a silane compound.

The silane compound used in the present invention, although not restricted in a particular manner, is preferably at least one kind of compound selected from the group consisting of silane coupling agents, silazanes, chlorosilanes, and alkoxysilanes.

The silane coupling agent used in the present invention is a compound expressed by General Formula (1):

$$XSiR_3 \qquad (1)$$

where X represents a functional group that reacts with an organic material, and R represents a hydrolytic functional group that reacts with an inorganic material. The silane coupling agent has two different functional groups in the single molecule, and combines the surface of an organic material and that of an inorganic material.

The functional group represented by X, not restricted in a particular manner as long as it reacts with an organic material, may be, to name some examples, an amino group, vinyl group, epoxy group, mercapt group, glycidoxy group, methacryl group, or chloro group.

The hydrolytic functional group represented by R, not restricted in a particular manner as long as it reacts with an inorganic material, may be, to name a few examples, an alkoxy group or chloro group. Especially preferred among them are a methoxy group and an ethoxy group.

The silane coupling agent, not restricted in a particular manner, is, to name a few examples, β-(3,4-epoxycyclohexyl)ethyltrimethoxysilane, γ-glycidoxypropylmethyldiethoxysilane, N-β-aminoethyl-γ-aminopropyltrimethoxysilane, or γ-aminopropyltriethoxysilane.

The silane coupling agent, as well as being preferably used for processing the surfaces of the gate insulating film 13 and the transparent conductive films 17 and 17', is very effective as a component of a primer to improve the adhesion of the interlayer insulating film 19 to the gate insulating film 13 and to the transparent conductive films 17 and 17'.

The silazane, not restricted in a particular manner, is, to name a few examples, disilazane, trisilazane, or hexamethyldisilazane.

Examples of the chlorosilane, in addition to the compounds listed as examples of the silane coupling agent, include trimethylchlorosilane, ethyltrichlorosilane, methylchlorosilane, methyldichlorosilane, dimethyldichlorosilane, methyltrichlorosilane, tetramethylsilane, trichlorosilane, ethyldichlorosilane, diethyldichlorosilane, triethylchlorosilane, ethyl-n-propyl-dichlorosilane, ethylisobutyl-dichlorosilane, di-n-propyl-dichlorosilane, n-propyl-trichlorosilane, di-isopropyldichlorosilane, di-n-butyl-dichlorosilane, n-butyl-trichlorosilane, di-t-butyl-dichlorosilane, phenyldichlorosilane, phenyltrichlorosilane, and diphenyl-dichlorosilane.

Examples of the alkoxysilane, in addition to the compounds listed as examples of the silane coupling agent, include n-butyltrimethoxysilane, dimethyldiethoxysilane, triethoxysilane, trimethoxysilane, trimethylmethoxysilane, trimethylethoxysilane, and polyethertrimethoxysilane that is expressed by General Formula (2):

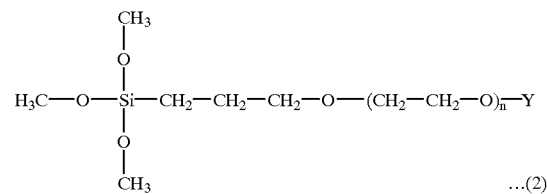

...(2)

Any one of the silane compounds may be used alone, or alternatively, a plurality of them can be used in combination. Preferred compounds among them are those containing an alkoxy group (especially, a methoxy group or ethoxy group), as well as a polyether group, a long-chained hydrocarbon group such as an alkyl group or a dialkyl group, and the like. Polyethertrimethoxysilane expressed by General Formula (2) is especially preferred.

If the gate insulating film 13, the transparent conductive films 17 and 17', or the interlayer insulating film 19 is (are) processed with the silane compound above, an appropriate silane compound may be selected depending on the material constituting the film, the processing method, the wettability with respect to the film, etc.

The method of processing at least one kind of film selected from the group consisting of the gate insulating film 13, the transparent conductive films 17 and 17', and the interlayer insulating film 19 with a silane compound is not restricted in a particular manner. Examples include:

(i) a method of blending the silane compound with the resin that forms the interlayer insulating film 19, (ii) a method of changing the properties of the surfaces of the gate insulating film 13, the transparent conductive films 17 and 17', etc with the silane compound.

If Method (ii) is employed, after the deposition of a film to be processed (e.g., the gate insulating film 13 or transparent conductive films 17 and 17'), the film is processed with the silane compound before proceeding to a next step. Alternatively, the surface of the gate insulating film 13, the surfaces, of the transparent conductive films 17 and 17', that come in contact with the interlayer insulating film 19, etc. are processed with the silane compound before the deposition of the interlayer insulating film 19.

First, Method (i) will be explained.

If the silane compound is blended with the resin that forms the interlayer insulating film 19, the resin and the silane compound are mixed, and then the mixture is applied onto the TFT 4, the gate signal line 2, the source signal line 3, and the connecting electrode 5 with, for example, a spincoater.

The preferred amount of the silane compound, although variable depending on the kind of the silane compound to be used, is in a range of 0.01 weight percent to 10 weight percent, measured in ratio to the resin (organic material) that forms the interlayer insulating film 19. The amount of the silane compound to be used, that is, the blend concentration to the resin, is appropriately set within that range according to the kind of the film adjacent to the interlayer insulating film 19, the kind of the silane compound, etc., so as to most improve the adhesion.

Method (i) can be easily carried out and integrated into a manufacturing process, thereby improving the quality of the active matrix substrate 100 substantially without adding any complications to the manufacturing process. Method (i) improves the adhesion of the interlayer insulating film 19 to the gate insulating film 13, to the transparent conductive films 17 and 17', and to the pixel electrode 1 that contact the interlayer insulating film 19, simply by blending the silane compound with the interlayer insulating film 19 without changing the current process. Method (i) also prevents the interlayer insulating film 19 from peeling off the metal layer 18.

Polyethertrimethoxysilane expressed by General Formula (2) is especially preferred as the silane compound used with Method (i), since it can improve the adhesion of the interlayer insulating film 19 to the gate insulating film 13, to the transparent conductive films 17 and 17', and to the pixel electrode 1 that contact the interlayer insulating film 19 at the same time.

Next, Method (ii) will be explained.

Examples of Method (ii) include a primer method and a processing method using gas. According to a primer method, a silane compound blended with a proper solvent adheres to the surfaces of the gate insulating film 13, the transparent conductive films 17 and 17', etc., as it is applied onto those surfaces with, for example, a spincoater, and then dried. According to a processing method using gas, a solution containing a silane compound adheres to the surfaces of the gate insulating film 13, the transparent conductive films 17 and 17', etc., as it is sprayed onto those surfaces with a gas such as dry air or nitrogen gas.

The solvent is, for example, water, alcohol, water solution of acetic acid (concentration: 0.01 weight percent to 0.1 weight percent), toluene, xylene, ethyl acetate, methylethylketone, or acetone. However, the solvent is not restricted in a particular manner as long as it can dissolve or disperse the silane compound. Any one of the solvents may be used alone, or alternatively, a plurality of them can be mixed for use. Preferred solvents among them are alcohol and a mixed solvent of alcohol and water.

The concentration of the silane compound, although not restricted in a particular manner, is preferably in a range of 0.01 weight percent to 10 weight percent. There are no particular conditions for drying the solution that contains a silane compound and that is applied onto the surfaces of the gate insulating film 13, the transparent conductive films 17 and 17', etc. as long as the agent added to the silane compound can be removed. The preferred temperature at which the silane compound is dried (heated), although variable depending on the solvent used, is in a range of 120° C. to 140° C. The period of time during which the silane compound is dried (heated) is set according to the kind of the solvent used, the drying temperature, etc, and is not restricted in a particular manner. However, the drying typically takes approximately ten minutes.

The amount of the silane compound to be used, that is, the necessary amount of the silane compound, is decided by the minimum coating area of the silane compound. More specifically, the amount of the silane compound to be used is given by Amount of Silane Compound Used (g) =

$$\frac{\text{Surface Area of Inorganic Substance (m}^2\text{)}}{\text{Minimum Coating Area of Silane Compound (m}^2\,/\,\text{g)}}$$

The preferred thickness of the silane compound, although variable depending on the kind of the silane compound, is in a range of 1 nm to 50 nm. To achieve the best results from the processing, the thickness is most preferably set so that the silane compounds form a monomolecular film.

Figure 5:
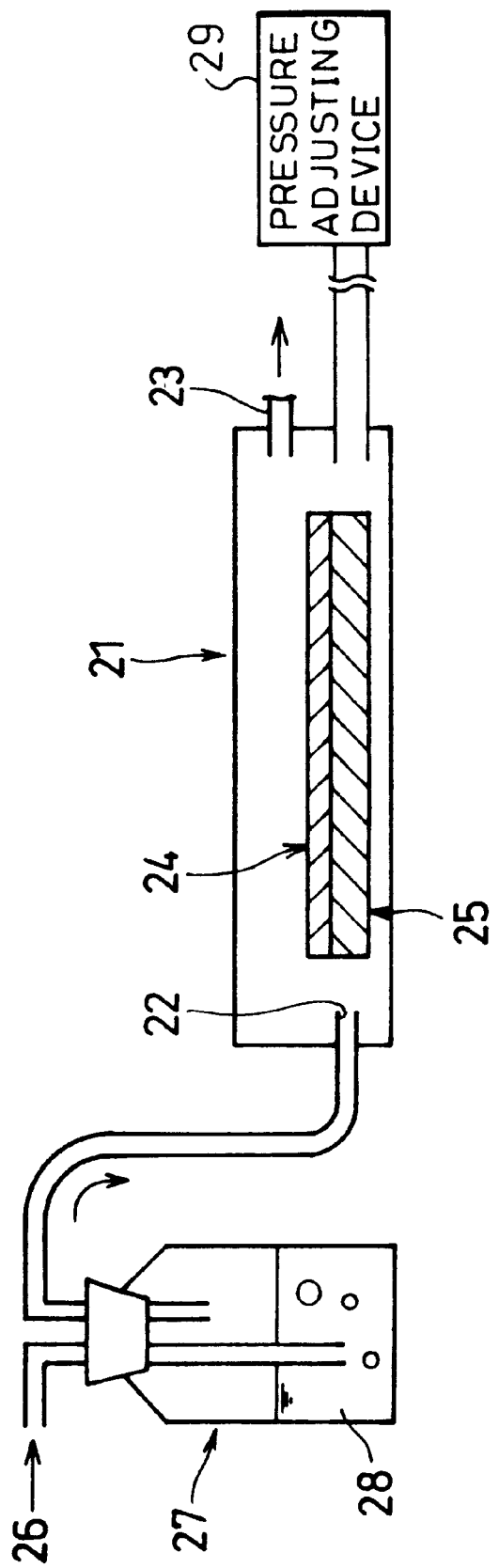
FIG. 5 is a simplified cross-sectional view showing a device for processing with a silane compound, installed in even another apparatus for manufacturing a substrate for use in a display element in accordance with the present invention.

If the processing method using gas is employed, the processing is preferably carried out with, for example, an apparatus for manufacturing a substrate for use in a display element, that incorporates a device for processing with a silane compound as substrate surface processing means shown in FIG. 5. The device for processing with a silane compound has a chamber 21 provided with an inflow port 22 and an outflow port 23 for a gas containing the silane compound, and a pressure adjusting device (pressure adjusting means) 29 for adjusting pressure inside the chamber 21. In the chamber 21 is installed a hot stage 25 having a substrate sucking port, as substrate heating means on which a substrate is placed and heated.

To process the surface of a film to be processed, for example, the surface of the gate insulating film 13, with a silane compound, using the above manufacturing apparatus, first, the insulating substrate 11 (member to be processed; hereinafter, will be simply referred to as the substrate 24) on which the gate insulating film 13 is already formed is placed on the hot stage 25. Next, a gas 26 containing a 99 volume percent of dry air or dry nitrogen is introduced into a container 27 containing a silane-compound-containing solution 28 and then bubbled. A mixed gas of air, nitrogen, or the like containing a gaseous silane compound is thereby introduced inside the chamber 21 via the inflow port 22. After the inside of the chamber 21 is replaced with the mixed gas, the surface of the substrate 24 is processed with the silane compound as it is heated by the hot stage 25.

The outflow port 23 is provided to the chamber 21 in FIG. 5. However, the outflow port 23 is not necessary if air inside the chamber 21 can be replaced with a gas without the outflow port 23. The hot stage 25 is not necessary if the substrate 24 is dry.

Instead of using the above apparatus for manufacturing a substrate for use in a display element, the processing method using gas can be alternatively carried out by directly spraying the silane-compound-containing solution 28 to the substrate 24 and then drying the substrate 24 on the hot stage 25. Nevertheless, the use of the apparatus for manufacturing a substrate for use in a display element allows the silane compound to uniformly adhere to the substrate 24, the concentration of the mixed gas in the chamber 21 to rise, and the heat loss during the heating of the substrate 24 on the hot stage 25 to decrease. Therefore, the use of the apparatus for manufacturing a substrate for use in a display element improves the efficiency of, and facilitates, the processing of the surfaces of the gate insulating film 13, the transparent conductive films 17 and 17', etc. with a silane compound, and manufactures a substrate for use in a display element that exhibits excellent adhesion.

The pressure inside the chamber 21 when the processing method using gas is employed, although not restricted in a particular manner, is preferably set to 0.5 normal atmosphere or higher.

Method (ii) has been described with respect to the processing of the surfaces of the gate insulating film 13, the transparent conductive films 17 and 17', etc.; however, this is not the only application of Method (ii). The surfaces of the interlayer insulating film 19 and the pixel electrode 1 that are composed of transparent conductive films can also be processed in the same manner. The processing of the surface of the pixel electrode 1 with a silane compound improves the adhesion between the pixel electrode 1 and the orientation film 20, the physical strength of the pixel electrode 1, etc., thereby producing an even more reliable active matrix substrate 100.

If Method (ii) is employed, different silane compounds can be used for different kinds of film-composing material. In other words, the most effective silane compound can be used according to the kind of the film. Hence, Method (ii) can produce an active matrix substrate which is further superior in the adhesion, the physical strength, etc.

For example, if the surface of the gate insulating film 13 made of SiNx is processed with a silane compound to improve the adhesion with the interlayer insulating film 19 made of an acrylic resin, the silane compound preferably contains as end groups, for example, an alkoxy group and either an alkyl group or a functional group selected from the group consisting of an epoxy group, an amino group and a polyether group. Especially preferred among them are the silane compounds containing as end groups an alkoxy group and an alkyl group (e.g., AY 43-204 (n-butyltrimethoxysilane available from Toray Dow Corning Inc. ), or SZ-6078 (dimethyldiethoxysilane available from Toray Dow Corning Inc.)), the silane compounds containing a methoxy group and a polyether group (e.g., KBM-641 (polyethertrimethoxysilane available from Shin-Etsu Chemical Co., Ltd.)), the silane compounds containing an ethoxy and an amino group (e.g., KBM-903 (γ-aminopropyltriethoxysilane available from Shin-Etsu Chemical Co., Ltd.)), and the like. In view of wettability, the silane compounds containing as end groups an alkoxy group and an alkyl group, and the silane compounds containing an ethoxy group and a polyether group are more preferred than the others. The wettability can be evaluated by, for example, a contact angle with respect to the film. The silane compound, preferably has a contact angle of not exceeding 10° C. The wettability can be improved by cleaning the surface of the film with, for example, ultraviolet light before the processing with a silane compound.

If the surfaces of the transparent conductive films 17 and 17' made of ITO are processed with a silane compound to improve the adhesion with the interlayer insulating film 19 made of an acrylic resin, the silane compound preferably contains, for example, a methoxy group and a polyether group (e.g., KBM-641 (polyethertrimethoxysilane available from Shin-Etsu Chemical Co., Ltd.)).

Figure 6A:
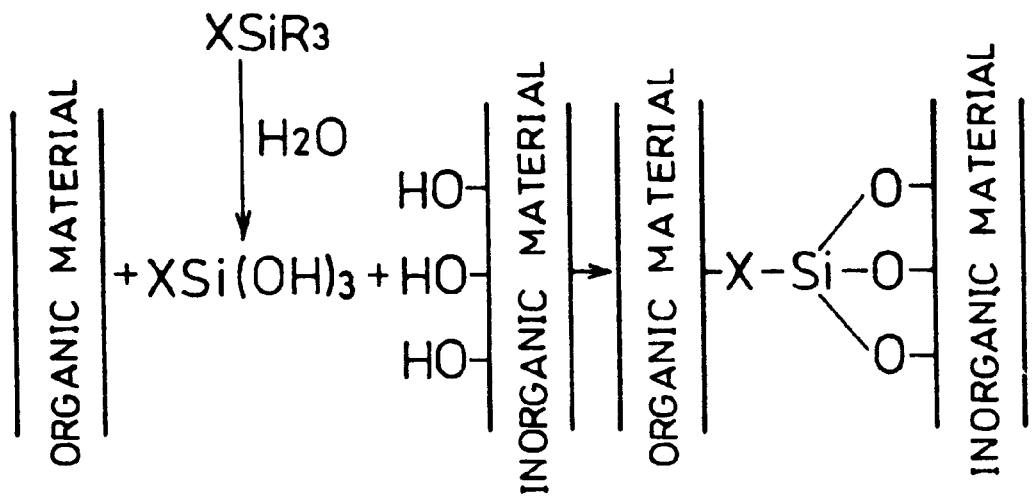
FIGS. 6(a) and 6(b) are explanatory drawings showing the mechanism of chemical reactions of the processing with a silane compound in accordance with the present invention.
Figure 6B:
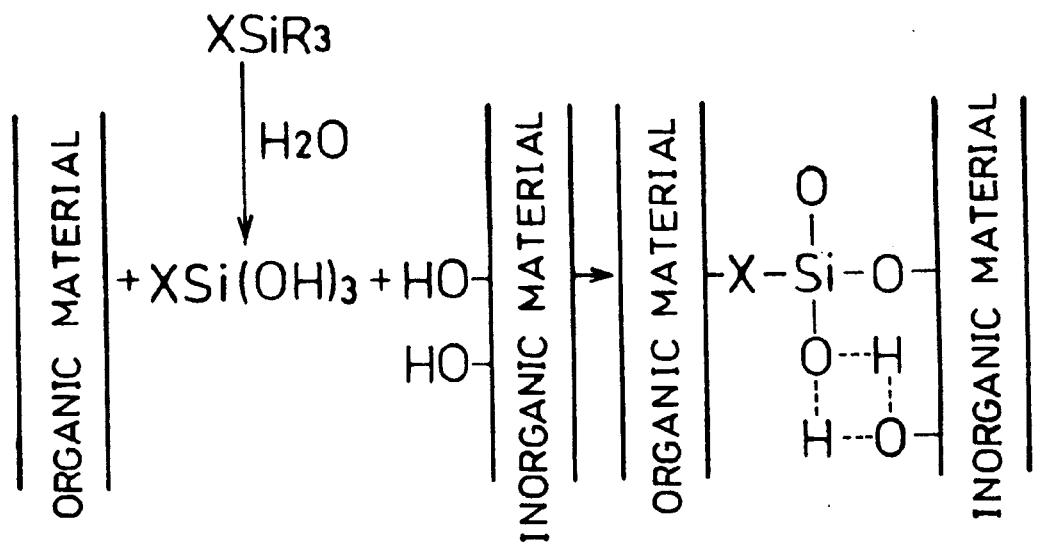

If the gate insulating film 13, the transparent conductive films 17 and 17', or the interlayer insulating film 19 is(are) processed with the silane compound in the above manner, chemical covalent bonding happens between the inorganic material composing the gate insulating film 13, the transparent conductive films 17 and 17' and the organic material composing the interlayer insulating film 19 as shown in FIGS. 6(a) and 6(b). In this case, the silane compound is decomposed by hydrolysis into silanol which forms siloxane bonding with the surface of the inorganic material. Meanwhile, the functional group represented by X reacts, and forms a bridge, with the surface of the organic material.

Therefore, the processing of the gate insulating film 13, the transparent conductive films 17 and 17', etc. or the interlayer insulating film 19 with the silane compound can improve, for example, the adhesion of the inorganic material to the organic material, and hence the adhesion of the gate insulating film 13 and the transparent conductive films 17 and 17' to the interlayer insulating film 19. In addition, the processing of at least one kind of film selected from the group consisting of the gate insulating film 13, the transparent conductive films 17 and 17', and the interlayer insulating film 19 with the silane compound enhances the physical strength of the films, thereby enhancing the physical strength of the active matrix substrate 100 obtained, and restraining a drop in physical strength of the active matrix substrate 100 obtained at high humidity.

The active matrix substrate 100 obtained as above and the liquid crystal display element incorporating this active matrix substrate 100 have an adhesion strength of at least 10 kg/cm$^2$, and more specifically, 10 kg/cm$^2$ to 30 kg/cm$^2$, which is a great improvement on the conventionally available adhesion strength. Even after the active matrix substrate 100 and the liquid crystal display element are preserved for 24 hours in accordance with pressure cooker test (PCT), no films peel between the gate insulating film 13 and the interlayer insulating film 19 and between the transparent conductive films 17 and 17' and the interlayer insulating film 19 in the sealing section and the pixel section. Moreover, the interlayer insulating film 19 neither swells nor peels, for example, in the cleaning step after the forming of the contact hole 6, not damaging the performance of the active matrix substrate 100 and the liquid crystal display element. The configuration hence allows the active matrix substrate 100 to be highly durable and reliable.

To further enhance the adhesion of the films composing the active matrix substrate 100 (i.e., adhesion strength of the active matrix substrate 100), and the adhesion strength of the liquid crystal display element incorporating the active matrix substrate 100, the cleaning and the processing with a silane compound are both carried out. For example, the gate insulating film 13, the transparent conductive films 17 and 17', etc., or the interlayer insulating film 19 is(are) processed with a silane compound, preferably, after the surfaces of the gate insulating film 13, the transparent conductive films 17 and 17', etc. are processed with vacuum ultraviolet light or ultraviolet light.

The active matrix substrate 100 obtained with the two kinds of processing (processing with vacuum ultraviolet light or ultraviolet light and processing with a silane compound) and the liquid crystal display element incorporating this active matrix substrate 100 have an adhesion strength of at least 10 kg/cm$^2$, and more specifically, 20 kg/cm$^2$ to 60 kg/cm$^2$, which is a great improvement on the conventionally available adhesion strength. Even after the active matrix substrate 100 and the liquid crystal display element are preserved for 24 hours in accordance with pressure cooker test (PCT), no films peel between the gate insulating film 13 and the interlayer insulating film 19 and between the transparent conductive films 17 and 17' and the interlayer insulating film 19 in the sealing section and the pixel section. Moreover, the interlayer insulating film 19 neither swells nor peels, for example, in the cleaning step after the forming of the contact hole 6, not damaging the performance of the active matrix substrate 100 and the liquid crystal display element. The configuration hence allows the active matrix substrate 100 to be highly durable and reliable.

In the description so far, the transparent conductive film 17' has been used as the connecting electrode 5 that connects the pixel electrode 1 to the drain electrode 16b. Alternatively, the pixel electrode 1 may be directly connected to the drain electrode 16b via the contact hole 6.

In the description so far, the TFT 4 incorporated in the active matrix substrate 100 has been of a so-called inverted staggered type, according to which the gate electrode 12 is provided to the insulating substrate 11. Alternatively, a TFT of a staggered type may be used, according to which the source electrode 16a and the drain electrode 16b are provided to the insulating substrate 11.

The TFTs are not the only possible switching element. Alternatively, various kinds of switching elements such as metal-insulator-metal (diodes) (MIMs) may be used. The present invention can be applied as long as the active matrix substrate incorporating switching elements is so configured that, for example, the organic insulating film contacts the inorganic insulating film and/or the transparent conductive film in order to increase the aperture ratio.

In the present embodiment, an active matrix substrate has been used as the substrate for use in a display element. However, the cleaning in accordance with the present invention can be applied to any substrate for use in a display element as long as the substrate has at least a pair of films deposited adjacently. Also, the processing with a silane compound in accordance with the present invention can be applied to any substrate for use in a display element as long as the substrate is so configured that the organic insulating film contacts an inorganic insulating film and/or a transparent conductive film. Also, in the present embodiment, the substrate for use in a display element has been incorporated in a liquid crystal display element as an example of a display element. However, the substrate, not limited only to such use, can be incorporated into display devices in general that include a display medium having electro-optic characteristics.

In any of the above cases, a substrate for use in a display element boasting excellent adhesion between the first and second films can be obtained by processing the surface of the first film on which the second film is deposited adjacently, using vacuum ultraviolet light or with ultraviolet light in an atmosphere of ozone. Also, if the organic insulating film contacts an inorganic insulating film, a transparent conductive film or the like, a substrate for use in a display element boasting excellent adhesion between the organic insulating film and the inorganic insulating film, the transparent conductive film, etc. can be obtained by processing the organic insulating film or the inorganic insulating film, the transparent conductive film, etc. with a silane compound. A highly reliable display element can be hence obtained by using the above-described substrate for use in a display element.

The substrate for use in a display element is preferably used in a display element built in, for instance, office automation (OA) equipment and audio visual (AV) devices, such as a large-scale display device, car navigation system, and laptop-type personal computer.

The following description will further explain the present invention in specific manners by way of embodiments. However, the description by no means limits the scope of the present invention. The adhesion of the organic insulating film to the transparent conductive film and to the inorganic insulating film will be evaluated in the following embodiments.

Throughout the following embodiments, ITO will be used for the transparent conductive film, SiNx for the inorganic insulating film, a photosensitive and transparent acrylic resin that can be developed with an alkaline solution for the organic insulating film, a polymer obtained by polymerizing methacrylic acid and glycylmethacrylate for the base polymer of the acrylic resin, and a naphthoxydiazide compound as positive photosensitive agent for the photosensitive agent. Note that "%" in the embodiments represent "weight percent".

FIRST EMBODIMENT

KBM-641 (polyethertrimethoxysilane available from Shin-Etsu Chemical Co., Ltd.) as a silane compound was mixed with an acrylic resin that would form organic insulating films, and then stirred with ultrasonic wave for 10 minutes, to prepare uniform mixtures of (a) 0.25%, (b) 0.5%, (c) 1.0%, (d) 2.0% and (e) 4.0%.

Thereafter the mixtures were cleaned in a 2% NaOH water solution with ultrasonic wave for 20 minutes, and then further cleaned in pure water with ultrasonic wave for 10 minutes.

Next, the mixtures were applied with a spincoater onto an SiNx substrate and an ITO substrate, of a square shape of 5 ins.×5 ins., that had undergone steam-drying in advance with isopropyl alcohol (IPA) for 240 seconds, to form the organic insulating films. Conditions for the spin-coating are:

$$0 \text{ rpm} \xrightarrow{1.6 \text{ sec.}} \begin{array}{c} 800 \text{ rpm} \\ 10 \text{ sec.} \end{array} \xrightarrow{1.6 \text{ sec.}} 0 \text{ rpm}$$

Next, the organic insulating films were pre-baked for 300 seconds at a temperature of 90° C., and then post-baked for 60 minutes at a temperature of 220° C.

Figure 7:
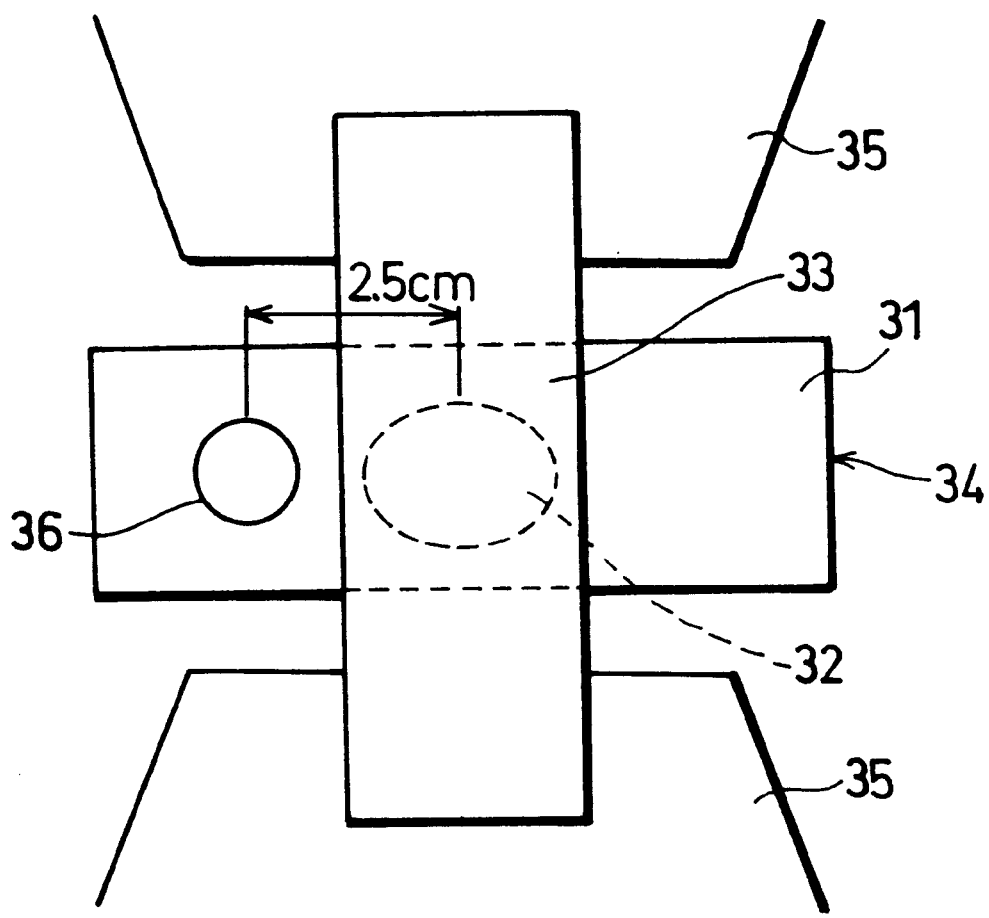
FIG. 7 is an explanatory drawing showing a cross-shaped cell for peeling test and also showing its measuring method.

Thereafter, the substrates on which the organic insulating films had been deposited (hereinafter, will be referred to as the substrates 31) were cut into 8.5 cm×2.0 cm. Then, as shown in FIG. 7, a predetermined amount of a thermosetting sealant (e.g., Stractbond XN-21S available from Mitsui Toatsu Chemicals, Inc.) 32 mixed with spacers of 5 μm was dropped on the substrates 31, which then underwent levelling for 30 minutes at a temperature of 80° C. Subsequently, the substrates 31 were combined with ITO substrates 33 of the same size as the substrates 31, secured together with clips, and then baked for 90 minutes at a temperature of 180° C., to obtain cross-shaped cells 34.

So-called peeling test for measuring the adhesion strength (kg/cm$^2$) of the cross-shaped cells 34 was conducted by placing the cross-shaped cells 34 on a fixing table 35 and then applying weight through the use of balls 36 of 10 mm in diameter, that were placed 2.5 cm away from the centers of the sealant 32 of the substrates 31. Three cells were tested in the peeling test for each of the concentrations (a) to (e) with an autograph available from Shimadzu Corporation.

Figure 8:
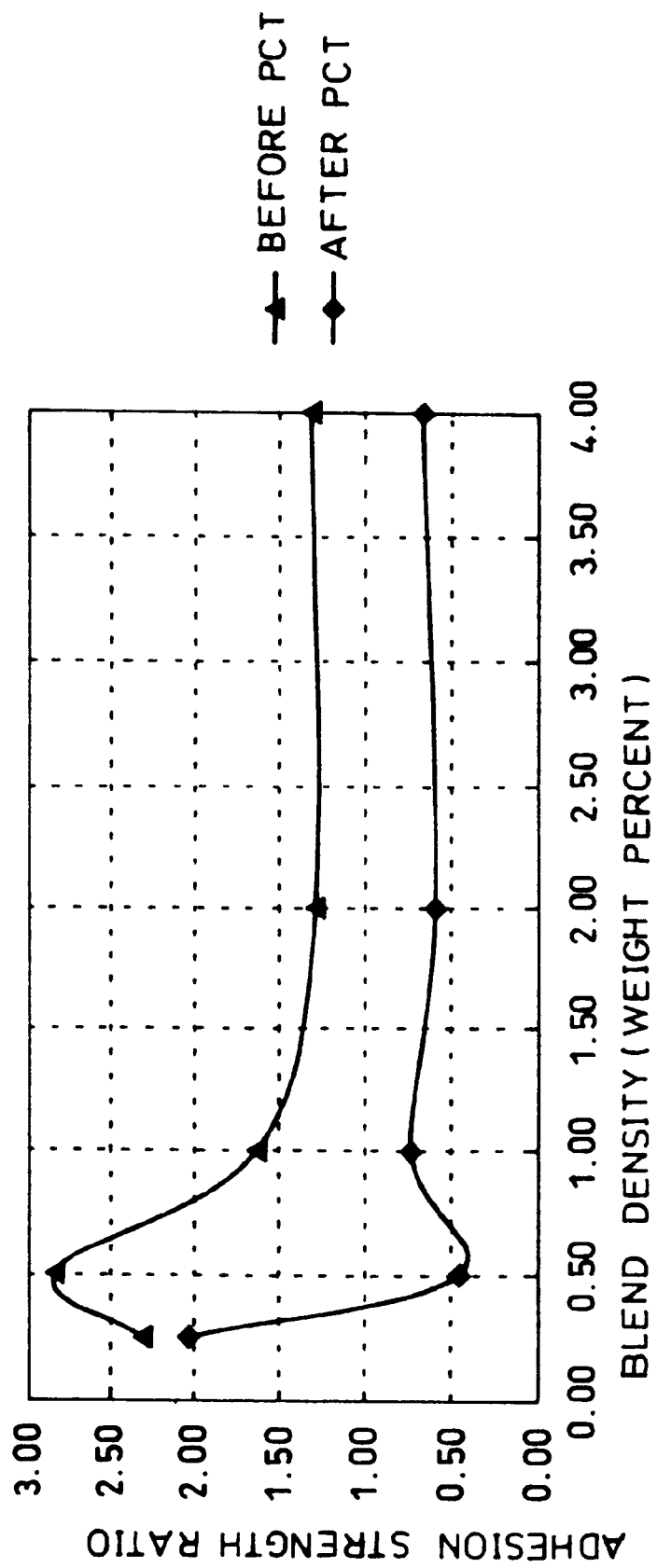
FIG. 8 is a graph showing correlation between the adhesion strength ratio of the cross-shaped cell and the blend concentration of a silane compound, when the cross-shaped cell is formed with a photosensitive polymer blended with the silane compound, as an organic insulating material.

Results of the measurement when the substrates 31 were SiNx substrates are shown in FIG. 8. The axis of abscissas represents blend concentrations of KBM-641 to the acrylic resin, and the axis of ordinates represents average relative strengths (adhesion strength ratios). The average relative strengths are denoted in ratios to the adhesion strengths of cross-shaped cells 34 whose organic insulating films had not been processed with a silane compound, or namely KBM-641.

The same peeling test as above was conducted again with the same cross-shaped cells 34 after the cross-shaped cells 34 had been preserved for 24 hours in accordance with pressure cooker test (PCT). Results of the measurement are shown in FIG. 8 together with the previous results.

FIG. 8 shows that the cross-shaped cells 34 that had been all processed with KBM-641 possessed a higher adhesion strength than the cross-shaped cells 34 that had not. FIG. 8 also shows that when KBM-641 was used, the 0.5% KBM-641 mixture gave the best adhesion strength ratio before PCT, whereas the 0.25% KBM-641 mixture gave the least degradation in adhesion strength ratio in PCT. Since the cross-shaped cells 34 possessed an excellent adhesion strength both before and after POT when the blend concentration is 0.25%, it is concluded that the most appropriate amount of KBM-641 to be added is 0.25%. The blending method simply requires mixing a silane compound with an organic material that composes the interlayer insulating film 19 without changing the current processing device, which is very easy and convenient.

SECOND EMBODIMENT

First, KBM-641 was added to a mixed solvent of water:methanol=1:2 at a ratio of 1% to that mixed solvent, and then stirred with ultrasonic wave for 10 minutes, to prepare a uniform mixed solution. Next, the mixed solution was applied with a spincoater onto an SiNx substrate and an ITO substrate, of a square shape of 5 ins.×5 ins., that had undergone steam-drying in advance with IPA for 240 seconds. Conditions for the spin-coating are:

$$0 \text{ rpm} \xrightarrow{1\text{sec.}} \begin{array}{c} 1500 \text{ rpm} \\ 20 \text{ sec.} \end{array} \xrightarrow{1\text{sec.}} 0 \text{ rpm}$$

Thereafter, the substrates onto which the mixed solution had been applied were baked for 10 minutes at a temperature of 120° C.

Next, an acrylic resin was applied with a spincoater onto the substrates under the same spin conditions as in the first embodiment, to form the organic insulating films. Next, the organic insulating films were pre-baked for 300 seconds at a temperature of 90° C., and then post-baked for 60 minutes at a temperature of 220° C.

Thereafter, cross-shaped cells 34 were prepared from the substrates on which the organic insulating films had been deposited in the same manner as in the first embodiment. Then, the same peeling test as in the first embodiment was conducted to measure average relative strengths (adhesion strength ratios). The average relative strengths are denoted in ratios to the adhesion strengths of cross-shaped cells 34 composed of either an SiNx substrate or an ITO substrate that had not been processed with a silane compound.

The same peeling test as above was conducted again with the same cross-shaped cells 34 after the cross-shaped cells 34 had been preserved for 24 hours in accordance with pressure cooker test (PCT). Results of the measurement are shown in Table 1 together with the previous results.

TABLE 1

| | Before PCT | | After PCT | |
|---|---|---|---|---|
| Substrate Processed with Silane | Adhesion Strength (kg/cm$^2$) | Adhesion Strength Ratio | Adhesion Strength (kg/cm$^2$) | Adhesion Strength Ratio |
| ITO | 25.19 | 3.3 | 4.23 | 3.4 |
| SiNx | 14.08 | 3.0 | 1.87 | 1.0 |

Table 1 shows that the processing of the substrate with KBM-641 improved the adhesion strength before PCT for both the ITO substrate and the SiNx substrate, and also improved the adhesion strength after PCT for the ITO substrate, but did not improve the adhesion strength after PCT for the SiNx substrate.

THIRD EMBODIMENT

The adhesion strength ratios of cross-shaped cells 34 were measured in the same manner as in the first and second embodiments, except that the cross-shaped cells 34 were processed with, instead of KBM-641, one of the following silane compounds: KBM-303 (β-(3,4-epoxycyclohexyl) ethyltrimethoxysilane available from Shin-Etsu Chemical Co., Ltd.), KBE-402 (γ-glycidoxypropylmethyldiethoxysilane available from Shin-Etsu Chemical Co., Ltd.), KBM-603 (N-β-aminoethyl-γ-aminopropyltrimethoxysilane available from Shin-Etsu Chemical Co., Ltd.), KBM-903 (γ-aminopropyltriethoxysilane available from Shin-Etsu Chemical Co., Ltd.), AY 43-204 (n-butyltrimethoxysilane available from Toray Dow Corning Inc.), and SZ-6078 (dimethyldiethoxysilane available from Toray Dow Corning Inc.).

Results of the measurement include: When either KBM-603 or KBM-903 was used according to the blending method with an acrylic resin that would form organic insulating films, the material composing the resin gelled. When either KBM-303 or KBE-402 was used according to the blending method, the adhesion strength did not improve for any kinds of substrates. When any of the above listed compounds was used according to the primer method, the adhesion strength little improved for a combination of ITO substrates, but did improve for a combination of an ITO substrate and an SiNx substrate. It is concluded that KBM-603, KBM-903, KBM-303 and KBE-402 are useful when the surface of an SiNx substrate is processed according to the primer method.

When SZ-6078 was used, the adhesion strength did not improve for a combination of ITO substrates, but did improve for a combination of an ITO substrate and an SiNx substrate regardless of whether SZ-6078 was used according to the blending method or the primer method. Especially, when SZ-6078 was used with the primer method, the adhesion strength ratio was as high as 3.7, which is a great improvement on the conventionally available adhesion strength. When AY 43-204 was used with the blending method, the adhesion strength did not improve. Meanwhile, when AY 43-204 was used with the primer method, the adhesion strength did not improve for a combination of ITO substrates, but did improve for a combination of an ITO substrate and an SiNx substrate, producing an adhesion strength ratio of 3.0, which is a great improvement on the conventionally available adhesion strength.

FOURTH EMBODIMENT

First, as shown in FIG. 3, an SiNx substrate and an ITO substrate of a square shape of 5 ins.×5 ins. as the substrates 45 were placed on the movable stage 43 installed in the duct-equipped chamber 40 of the device for processing with vacuum ultraviolet light. Then, the surfaces of the substrates 45 were irradiated with vacuum ultraviolet light of 172 nm radiating from the excimer lamp as the vacuum ultraviolet light generator 44 for 30 seconds. Here, the distance between the excimer lamp and the surfaces of the substrates 45 is set to 1 mm.

Next, three kinds of cleaning and drying processes were carried out under various conditions with the substrates 45 that had been irradiated with vacuum ultraviolet light. The conditions are:

① nitrogen blow,

② nitrogen blow after cleaning in pure water with ultrasonic wave for 5 minutes, ③ Cleaning and drying with IPA steam for 240 seconds after cleaning in pure water with ultrasonic wave for 5 minutes.

Next, the organic insulating films were formed by applying the acrylic resin which is a transparent resin material with a spincoater onto the substrates 45 that had undergone the cleaning and drying process. Conditions for the spin-coating here are the same as in the first embodiment.

Thereafter, the applied transparent resin material was pre-baked for 300 seconds at a temperature of 90° C., and then post-baked for 60 minutes at a temperature of 220° C.

Thereafter, the substrates on which the organic insulating films had been deposited (hereinafter, will be referred to as the substrates 31) were cut into 8.5 cm×2.0 cm. Then, cross-shaped cells 34 were prepared from the substrates 31 in the same manner as in the first embodiment. Then, the same peeling test as in the first embodiment was conducted, using an autograph available from Shimadzu Corporation, to measure the adhesion strength (kg/cm$^2$) of the cross-shaped cells 34. Three cells were tested in the peeling test for each kind of the cross-shaped cells 34 that had undergone the cleaning processes ① to ③. Adhesion strength (kg/cm$^2$) was measured with cross-shaped cells 34 that had not undergone any of the above cleaning processes (cleaning with vacuum ultraviolet light, cleaning in pure water, cleaning and drying with IPA).

The same peeling test as above was conducted again with the same cross-shaped cells 34 after the cross-shaped cells 34 had been preserved for 24 hours in accordance with pressure cooker test (PCT). Results of the measurement are shown in Table 2 together with the previous results. The results of the measurement when SiNx substrates was used as the substrates 31 are shown also in FIG. 9, and those when ITO substrates was used as the substrates 31 are shown also in FIG. 10. The axes of ordinates in FIGS. 9 and 10 represent average relative strengths (adhesion strength ratios) that are denoted in ratios to the adhesion strengths of cross-shaped cells 34 that had undergone none of the above cleaning processes ① to ③.

TABLE 2

| Substrate Processed with Silane | Conditions for Cleaning | Before PCT Adhesion Strength (kg/cm$^2$) | Before PCT Adhesion Strength Ratio | After PCT Adhesion Strength (kg/cm$^2$) | After PCT Adhesion Strength Ratio |
|---|---|---|---|---|---|
| ITO | ① | 8.43 | 1.1 | 3.58 | 2.8 |
|  | ② | 10.25 | 1.4 | 3.76 | 3.0 |
|  | ③ | 12.94 | 1.7 | 5.02 | 4.0 |
|  | Unprocessed | 7.60 | 1.0 | 1.26 | 1.0 |
| SiNx | ① | 9.80 | 2.1 | 4.35 | 2.4 |
|  | ② | 6.98 | 1.5 | 2.54 | 1.4 |
|  | ③ | 11.73 | 2.5 | 1.29 | 0.7 |
|  | Unprocessed | 4.69 | 1.0 | 1.81 | 1.0 |

Figure 9:
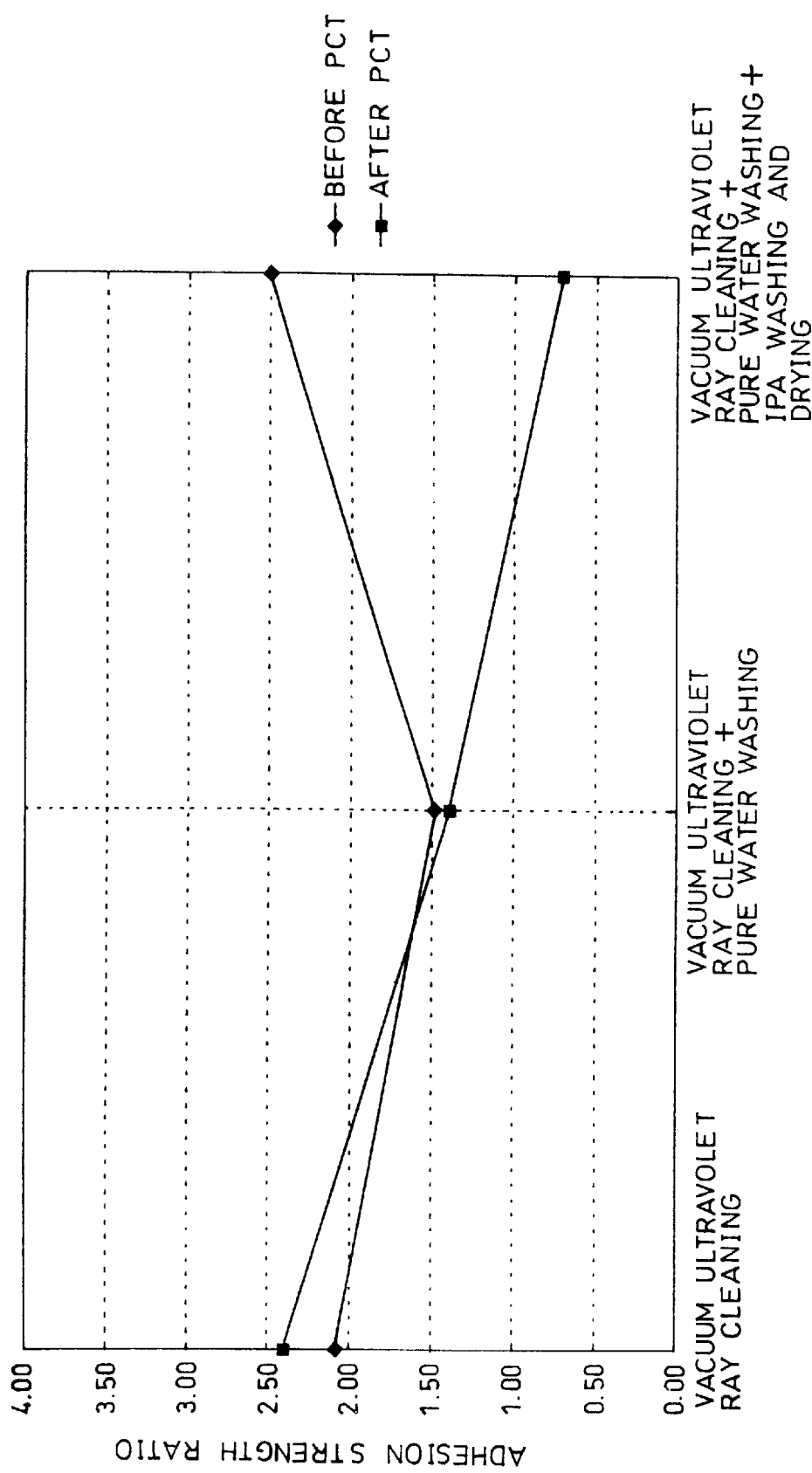
FIG. 9 is a graph showing correlation between the adhesion strength ratio of the cross-shaped cell and the cleaning and drying methods of an SiNx substrate after the cleaning with vacuum ultraviolet light.
Figure 10:
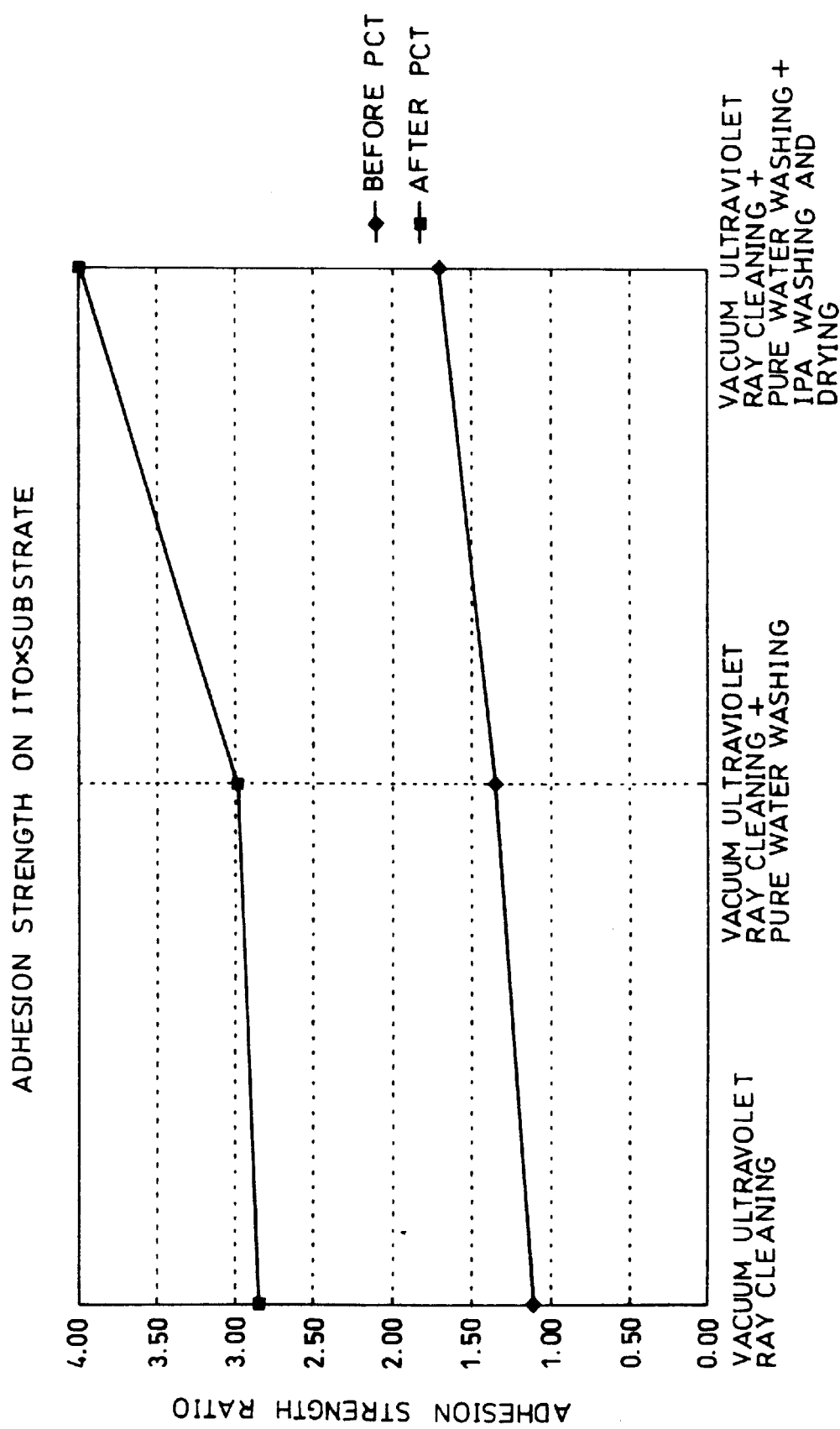
FIG. 10 is a graph showing correlation between the adhesion strength ratio of the cross-shaped cell and the cleaning and drying methods of an ITO substrate after the cleaning with vacuum ultraviolet light.

Table 2 and FIGS. 9 and 10 show that the cleaning with vacuum ultraviolet light radiating from the excimer lamp improved the adhesion strength of the cross-shaped cells 34 regardless of the cleaning methods that followed, and that the cleaning with vacuum ultraviolet light radiating from the excimer lamp also improved the adhesion strength of the cross-shaped cells 34 that had been preserved for 24 hours in accordance with pressure cooker test (PCT).

The same results were obtained by carrying out the cleaning process, using the device for processing with ultraviolet light shown in FIG. 4 instead of using the excimer lamp.

FIFTH EMBODIMENT

First, KBM-641 (polyethertrimethoxysilane available from Shin-Etsu Chemical Co., Ltd.) as a silane compound was mixed with an acrylic resin that would form organic insulating films at a ratio of 0.25%, and then stirred with ultrasonic wave for 10 minutes, to prepare a uniform mixture.

Meanwhile, the SiNx and ITO substrates of a square shape of 5 ins.×5 ins. underwent the cleaning process with vacuum ultraviolet light, and one of the cleaning and drying processes of ① to ③ in the same manner as in the fourth embodiment.

Next, the organic insulating films were formed by applying the mixture with a spincoater onto the substrates that had undergone the cleaning and drying process. Conditions for the spin-coating here are the same as in the first embodiment. Next, the applied mixture was pre-baked for 300 seconds at a temperature of 90° C., and then post-baked for 60 minutes at a temperature of 220° C.

Thereafter, the substrates on which the organic insulating films had been deposited were cut into 8.5 cm×2.0 cm. Then, the same peeling test as in the first embodiment was conducted to measure adhesion strength. Results of the measurement include: The cross-shaped cells 34 that had been processed with KBM-641 exhibited two to four times as large an improvement in adhesion strength as those that had undergone only the cleaning process without being processed with KBM-641. The cross-shaped cells 34 that had been preserved for 24 hours in accordance with PCT exhibited a similar improvement in adhesion strength. The blending method simply requires mixing a silane compound with an organic material that composes the interlayer insulating film 19 without changing the current processing device, which is very easy and convenient.

SIXTH EMBODIMENT

First, KBM-641 was added to a mixed solvent of water:methanol=1:2 at a ratio of 1% to that mixed solvent, and then stirred with ultrasonic wave for 10 minutes, to prepare a uniform mixed solution.

Meanwhile, the SiNx and ITO substrates of a square shape of 5 ins.×5 ins. underwent the cleaning process with vacuum ultraviolet light, and one of the cleaning and drying processes of ① to ③ in the same manner as in the fourth embodiment.

Next, the mixed solution was applied with a spincoater onto the substrates that had undergone the cleaning and drying process. Conditions for the spin-coating are:

| 0 rpm | → | 1500 rpm | → | 0 rpm |
|---|---|---|---|---|
|  | 1 sec. | 20 sec. | 1 sec. |  |

Thereafter, the substrates onto which the mixed solution had been applied were baked for 10 minutes at a temperature of 120° C.

The insulating films were then formed on the substrates with the same method and under the same conditions as in the first embodiment. Next, the organic insulating films were pre-baked for 300 seconds at a temperature of 90° C., and then post-baked for 60 minutes at a temperature of 220° C.

Thereafter, the substrates on which the organic insulating films had been deposited were cut into 8.5 cm×2.0 cm. Then, the same peeling test as in the first embodiment was conducted to measure adhesion strength. Results of the measurement include: The cross-shaped cells 34 that had been processed with KBM-641 exhibited two to three times as large an improvement in adhesion strength as those that had undergone only the cleaning process without being processed with KBM-641. The cross-shaped cells 34 that had been preserved for 24 hours in accordance with PCT exhibited a similar improvement in adhesion strength.

SEVENTH EMBODIMENT

First, a TFT 4 was formed by sequentially depositing, on a glass substrate as an insulating substrate 11, a gate electrode 12, a gate insulating film 13, a semiconductor layer 14, a channel protecting layer 15, and an n$^+$Si layer that would form a source electrode 16a and a drain electrode 16b according to a known method. Next, transparent conductive films 17 and 17' and metal layers 18 and 18' were sequentially formed in a predetermined shape on edges of the source electrode 16a and the drain electrode 16b according to sputtering method.

Thereafter, the insulating substrate 11 on which the transparent conductive films 17 and 17' and the metal layers 18 and 18' had been formed was cleaned with vacuum ultraviolet light according to the same method as in the first embodiment, cleaned with ultra pure water and then dried.

Next, an interlayer insulating film 19 was so formed as to have a thickness of 5 μm after pre-baking, by applying the acrylic resin onto the TFT 4, the transparent conductive films 17 and 17', and the metal layers 18 and 18'. The interlayer insulating film 19 was then exposed according to a predetermined pattern and developed with an inorganic alkaline solution (tetramethylammoniumhydroxide, TMAH). In this manner, only the exposed part of the interlayer insulating film 19 was etched with the inorganic alkaline solution, and the contact hole 6 penetrating the interlayer insulating film 19 was formed. Subsequently, the part that had been left unexposed was all exposed to eliminate the photosensitive agent. The interlayer insulating film 19 thus formed had a light transmittance of 90% or higher.

Then, a transparent conductive film that would form the pixel electrode 1 was formed on the interlayer insulating film 19 with sputtering method, and then made into a desired pattern. Here, the resist used for the patterning of the transparent conductive film that would form the pixel electrode 1 peeled with the resist removing liquid (e.g., dimethyl sulfoxide, or DMSO). When the resist peeled, no films peeled due to swelling of the interlayer insulating film 19.

An active matrix substrate 100 obtained as above had the pixel 1 electrically connected to the drain electrode 16b of the TFT 4 through the transparent conductive film 17' and the contact hole 6 penetrating the interlayer insulating film 19. Thereafter, a liquid crystal display device was formed by combining the active matrix substrate 100 and an opposite substrate 200 with a sealing member, then introducing liquid crystal 206 between the substrates, and mounting peripheral circuits such as a driving circuit around the display section.

The liquid crystal display device was preserved for 24 hours in accordance with PCT. However, the transparent conductive film 17' and the interlayer insulating film 19 did not peel off each other in the sealing section and the pixel section. Consequently, the liquid crystal display device did not lose its performance as a liquid crystal display device.

The same results were obtained by carrying out the cleaning process, using the device for processing with ultraviolet light shown in FIG. 4 instead of using the excimer lamp.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A substrate for use in a display element, comprising:
   an organic insulating film; and
   at least either an inorganic insulating film or a transparent conductive film,
   wherein the organic insulating film firmly adheres to at least either the inorganic insulating film or the transparent conductive film with at least one type of a silane compound selected from a group consisting of (i) a silane compound having, in a molecule, either a polyether group and an alkoxy group, an epoxy group and an alkoxy group, a glycidoxy group and an alkoxy group, or an alkyl group and an alkoxy group, (ii) a silazane, and (iii) chlorosilane, for avoidance of separation therebetween.

2. The substrate for use in a display element as defined in claim 1,
   wherein the organic insulating film is chemically bonded with at least either the inorganic insulating film or the transparent conductive film by the silane compound.

3. The substrate for use in a display element as defined in claim 1,
   wherein at least one kind of film selected from the group consisting of the organic insulating film, the inorganic insulating film, and the transparent conductive film has a surface processed with the silane compound.

4. The substrate for use in a display element as defined in claim 1,
   wherein a film composed of the silane compound is provided at least either between the organic insulating film and the inorganic insulating film or between the organic insulating film and the transparent conductive film so as to have a thickness of 1 nm to 50 nm.

5. The substrate for use in a display element as defined in claim 4,
wherein the film composed of the silane compound is a monomolecular film of the silane compound.

6. The substrate for use in a display element as defined in claim 1,
wherein the organic insulating film contains the silane compound.

7. The substrate for use in a display element as defined in claim 6,
wherein the organic insulating film contains the silane compound in a range of 0.01 weight percent to 10 weight percent, measured in ratio to an organic material composing the organic insulating film.

8. The substrate for use in a display element as defined in claim 1,
wherein the silane compound contains at least either a compound having, as end groups, an alkoxy group and an alkyl group or a compound having an ethoxy group and a polyether group.

9. The substrate for use in a display element as defined in claim 1,
wherein said substrate is an active matrix substrate configured so that a switching element, the organic insulating film, and a pixel electrode are sequentially deposited on an insulating substrate, the switching element having at least either an inorganic insulating film or a first transparent conductive film, the pixel electrode being composed of a second transparent conductive film, and so that the pixel electrode is electrically connected to a drain electrode of the switching element,
wherein the organic insulating film firmly adheres to at least either the inorganic insulating film or the transparent conductive films with the silane compound.

10. The substrate for use in a display element as defined in claim 9,
wherein the pixel electrode is electrically connected to the drain electrode of the switching element through a connecting electrode composed of the first transparent conductive film.

11. The substrate for use in a display element as defined in claim 1,
wherein said substrate is an active matrix substrate that has in a pixel section thereof a cross-sectional structure of either insulating substrate/first transparent conductive film or inorganic insulating film/organic insulating film/second transparent conductive film
wherein the organic insulating film firmly adheres to at least either the inorganic insulating film or the transparent conductive film with the silane compound.

12. The substrate for use in a display element as defined in claim 1,
wherein said substrate has an adhesion strength of not less than 10 kg/cm$^2$.

13. A display element, comprising a substrate for use in a display element, comprising:
an organic insulating film; and
at least either an inorganic insulating film or a transparent conductive film,
wherein the organic insulating film firmly adheres to at least either the inorganic insulating film or the transparent conductive film with at least one type of a silane compound selected from a group consisting of (i) a silane compound having, in a molecule, either a polyether group and an alkoxy group, an epoxy group and an alkoxy group, a glycidoxy group and an alkoxy group, or an alkyl group and an alkoxy group, (ii) a silazane, and (iii) chlorosilane, for avoidance of separation therebetween.

14. The substrate for use in a display element as defined in claim 1,
wherein the silane compound is a silane compound having, in a molecule, a polyether group and an alkoxy group.

15. The substrate for use in a display element as defined in claim 1,
wherein the silane compound is a silane compound having, in a molecule, a polyether group and a methoxy group.

16. The substrate for use in a display element as defined in claim 1,
wherein the silane compound is polyethertrimethoxysilane.

17. The substrate for use in a display element as defined in claim 1,
wherein the silane compound is polyethertrimethoxysilane,
at least one of the inorganic insulating film and the transparent electrode film is ITO, and
the organic insulating film firmly adheres to the ITO by a process comprising the step of
applying the silane compound to an interface between the ITO and the organic insulating film.

18. The substrate for use in a display element as defined in claim 1,
wherein the silane compound is polyethertrimethoxysilane,
at least one of the inorganic insulating film and the transparent electrode film is ITO, and
the organic insulating film firmly adheres to the ITO by a process comprising the step of
mixing the silane compound in the organic insulating film.

19. The substrate for use in a display element as defined in claim 1,
wherein the silane compound is polyethertrimethoxysilane,
at least one of the inorganic insulating film and the transparent electrode film is silicon nitride, and
the organic insulating film firmly adheres to the silicon nitride by a process comprising the step of
applying the silane compound to an interface between the silicon nitride and the organic insulating film.

20. The substrate for use in a display element as defined in claim 1,
wherein the silane compound is polyethertrimethoxysilane,
at least one of the inorganic insulating film and the transparent electrode film is silicon nitride, and
the organic insulating film firmly adheres to the silicon nitride by a process comprising the step of
mixing the silane compound in the organic insulating film.

21. The substrate for use in a display element as defined in claim 1,
wherein the silane compound is β-(3,4-epoxycyclohexyl)-ethyltrimethoxysilane,
at least one of the inorganic insulating film and the transparent electrode film is silicon nitride, and the organic insulating film firmly adheres to the silicon nitride by a process comprising the step of
applying the silane compound to an interface between the silicon nitride and the organic insulating film.

22. The substrate for use in a display element as defined in claim 1,
wherein the silane compound is γ-glycidoxypropylmethyldiethoxysilane,
at least one of the inorganic insulating film and the transparent electrode film is silicon nitride, and
the organic insulating film firmly adheres to the silicon nitride by a process comprising the step of
applying the silane compound to an interface between the silicon nitride and the organic insulating film.

23. The substrate for use in a display element as defined in claim 1,
wherein the silane compound is n-butyltrimethoxysilane,
at least one of the inorganic insulating film and the transparent electrode film is silicon nitride, and
the organic insulating film firmly adheres to the silicon nitride by a process comprising the step of
applying the silane compound to an interface between the silicon nitride and the organic insulating film.

24. The substrate for use in a display element as defined in claim 1,
wherein the silane compound is dimethyldiethoxysilane,
at least one of the inorganic insulating film and the transparent electrode film is silicon nitride, and
the organic insulating film firmly adheres to the silicon nitride by a process comprising the step of
applying the silane compound to an interface between the silicon nitride and the organic insulating film.

25. The substrate for use in a display element as defined in claim 13,
wherein the silane compound is a silane compound having, in a molecule, a polyether group and an alkoxy group.

26. The substrate for use in a display element as defined in claim 13,
wherein the silane compound is a silane compound having, in a molecule, a polyether group and a methoxy group.

27. The substrate for use in a display element as defined in claim 13,
wherein the silane compound is polyethertrimethoxysilane.

28. The substrate for use in a display element as defined in claim 13,
wherein the silane compound is polyethertrimethoxysilane,
at least one of the inorganic insulating film and the transparent electrode film is ITO, and
the organic insulating film firmly adheres to the ITO by a process comprising the step of
applying the silane compound to an interface between the ITO and the organic insulating film.

29. The substrate for use in a display element as defined in claim 13,
wherein the silane compound is polyethertrimethoxysilane,
at least one of the inorganic insulating film and the transparent electrode film is ITO, and
the organic insulating film firmly adheres to the ITO by a process comprising the step of
mixing the silane compound in the organic insulating film.

30. The substrate for use in a display element as defined in claim 13,
wherein the silane compound is polyethertrimethoxysilane,
at least one of the inorganic insulating film and the transparent electrode film is silicon nitride, and
the organic insulating film firmly adheres to the silicon nitride by a process comprising the step of
applying the silane compound to an interface between the silicon nitride and the organic insulating film.

31. The substrate for use in a display element as defined in claim 13,
wherein the silane compound is polyethertrimethoxysilane,
at least one of the inorganic insulating film and the transparent electrode film is silicon nitride, and
the organic insulating film firmly adheres to the silicon nitride by a process comprising the step of
mixing the silane compound in the organic insulating film.

32. The substrate for use in a display element as defined in claim 13,
wherein the silane compound is β-(3,4-epoxycyclohexyl)-ethyltrimethoxysilane,
at least one of the inorganic insulating film and the transparent electrode film is silicon nitride, and
the organic insulating film firmly adheres to the silicon nitride by a process comprising the step of
applying the silane compound to an interface between the silicon nitride and the organic insulating film.

33. The substrate for use in a display element as defined in claim 13,
wherein the silane compound is γ-glycidoxypropylmethyldiethoxysilane,
at least one of the inorganic insulating film and the transparent electrode film is silicon nitride, and
the organic insulating film firmly adheres to the silicon nitride by a process comprising the step of
applying the silane compound to an interface between the silicon nitride and the organic insulating film.

34. The substrate for use in a display element as defined in claim 13,
wherein the silane compound is n-butyltrimethoxysilane,
at least one of the inorganic insulating film and the transparent electrode film is silicon nitride, and
the organic insulating film firmly adheres to the silicon nitride by a process comprising the step of
applying the silane compound to an interface between the silicon nitride and the organic insulating film.

35. The substrate for use in a display element as defined in claim 13,
wherein the silane compound is dimethyldiethoxysilane,
at least one of the inorganic insulating film and the transparent electrode film is silicon nitride, and
the organic insulating film firmly adheres to the silicon nitride by a process comprising the step of
applying the silane compound to an interface between the silicon nitride and the organic insulating film.

* * * * *